(12) United States Patent
Brindle et al.

(10) Patent No.: US 6,730,953 B2
(45) Date of Patent: May 4, 2004

(54) APPARATUS, METHODS AND ARTICLES OF MANUFACTURE FOR A LOW CONTROL VOLTAGE SWITCH

(75) Inventors: Christopher N. Brindle, Dracut, MA (US); Mark F. Kelcourse, Lowell, MA (US)

(73) Assignee: Mia-Com, Inc., Lowell, MA (US)

( * ) Notice: Subject to any disclaimer, the term of this patent is extended or adjusted under 35 U.S.C. 154(b) by 0 days.

(21) Appl. No.: 10/391,259

(22) Filed: Mar. 18, 2003

(65) Prior Publication Data

US 2004/0051114 A1 Mar. 18, 2004

Related U.S. Application Data

(60) Provisional application No. 60/410,647, filed on Sep. 13, 2002.

(51) Int. Cl.[7] .................. H01L 27/108; H01L 29/76; H01L 29/94; H01L 31/113
(52) U.S. Cl. .................. 257/296; 257/379; 257/401
(58) Field of Search ................ 257/296, 379, 257/401

(56) References Cited

U.S. PATENT DOCUMENTS

| | | |
|---|---|---|
| 4,435,652 A | 3/1984 | Stevens |
| 4,877,976 A | 10/1989 | Lach et al. |
| 5,469,195 A | 11/1995 | Yung et al. |
| 5,594,441 A | 1/1997 | Coleman, Jr. |
| 5,600,602 A | 2/1997 | Seyyedy |
| 5,748,053 A | 5/1998 | Kameyama et al. |
| 6,211,726 B1 | 4/2001 | Daun-Lindberg et al. |
| 6,288,458 B1 | 9/2001 | Berndt |
| 6,426,525 B1 | 7/2002 | Brindle |
| 6,605,973 B1 * | 8/2003 | Chih .................. 327/309 |
| 2001/0040479 A1 | 11/2001 | Zhang |
| 2002/0121923 A1 * | 9/2002 | Drost et al. .......... 327/298 |

OTHER PUBLICATIONS

Tanaka et al. "A 3V MMIC Chip Set for 1.9GHz Mobile Communication Systems." Feb. 16, 1995. International Solid State Circuits Convention. pp. 144–145, 353.

* cited by examiner

Primary Examiner—Ngân V. Ngô

(57) ABSTRACT

A low control voltage switch utilizing a plurality of field effect transistors (FETs) having a total of six gates to allow the switch to operate at a low control voltage without the need to increase device periphery or die size. Feed-forward capacitors connected between the gate and source of an uppermost FET and the gate and drain of a lowermost FET are used to reduce signal distortion and improve the linearity and harmonic noise rejection characteristics of the FETs within the switch and thus lower the harmonics of the switch.

41 Claims, 34 Drawing Sheets

APPARATUS, METHODS AND ARTICLES OF MANUFACTURE FOR A LOW CONTROL VOLTAGE SWITCH

CROSS-REFERENCE TO RELATED APPLICATIONS

The present application claims the priority of U.S. Provisional Patent Application Ser. No. 60/410,647, filed on Sep. 13, 2002, which is herein incorporated in its entirety by reference.

FIELD OF INVENTION

The present invention relates generally to switch devices, and more particularly to solid-state switch devices.

BACKGROUND OF THE INVENTION

Conventional switch devices operate to control the path on which a signal travels. In general, there are two basic types of switch devices in use: electromechanical and solid state. All switches are considered active devices, in that some sort of power supply is required in order to function properly. In electromechanical switches, a contact is provided that physically changes position during the switching process. Solid-state switches do not contain any moving parts and instead use some kind of semiconductor device for the switching process, which are basically either diodes or transistors. In general, diode switches sense current as a control input while switches comprised of transistors sense voltages as control inputs. One example of a transistor-based switch is comprised of a plurality of field effect transistors (FETs). FET switches are generally known to be utilized in connection with high frequency signal transmission, for example, radio frequency (RF).

In general, a FET switch is in an ON state (very low resistance) allowing any signal to pass from the drain to the source of the FET until a control voltage of a predefined amount (pinch-off voltage) is applied to the gate of the FET. When the pinch-off voltage is applied, the FET switches to an OFF state (very high resistance) and prevents any signal passing from the drain to the source of the FET. The advantage of FET switch is that the control voltage applied to the gate of the FET draws very little current, consuming no power in performing the switching function.

A major drawback of FET switches is that in the OFF state, a signal that one may desire to prevent from passing through the FET from the drain to the source applies a voltage at the drain of the FET. This voltage travels through the FET to the gate and adds to the control voltage input. As this voltage becomes greater than the control voltage, the OFF state FET begins to turn ON as shown in the FIG. 1a.

In many of today's product designs, it is often desirable to require a lower control voltage for operation of a switch. For example, it may be beneficial to lower the control voltage of the switch having the exemplary characteristics of FIG. 1 from 5 volts to 2 volts while maintaining control over the same RF voltage. However, in order to reduce the control voltage of a switch, the RF voltage must be divided across additional FETs connected in series, as is shown in FIG. 1b.

The configuration illustrated in FIG. 1b reduces the control voltage needed, but increases the resistance in the ON state. To overcome this added resistance, each FET is made larger and thus an increase in die size for the switch is required. This size increase, however, introduces many new problems in the switch, including:

1. The switch costs more, requiring more semiconductor material to manufacture.

2. The switch has poorer isolation, providing less resistance in the OFF state.

3. The switch has greater leakage in the control line, requiring more power to control the switch Accordingly, there is a need for an improved switch that can control a current output at lower control voltages, while providing the optimum balance of insertion loss, isolation, maximum power handling, harmonic generation suppression, and leakage current in the control signal.

SUMMARY OF THE INVENTION

The present invention is directed to an apparatus, methods and articles of manufacture for a low control voltage switch. In one embodiment, the switch utilizes a plurality of field effect transistors (FETs) having a total of six gates to allow the switch to operate at a low control voltage without the need to increase device periphery or die size. The switch may include a single-gate FET architecture, a multi-gate FET architecture, or a mixed gate architecture, as long as the switch includes a total of six gates. The apparatus may utilize a plurality of parallel switches that are each connected to the same source voltage.

According to an exemplary embodiment of the invention, a switch also includes feed-forward capacitors. The feed-forward capacitors reduce signal distortion and improve the linearity and harmonic noise rejection characteristics of the FETs within the switch and thus lowers the harmonics of the switch. According to one embodiment, the switch includes two feed-forward capacitors. A first capacitor is connected between the gate and source of an uppermost FET and the second capacitor is connected between gate and drain of a lowermost FET.

According to another exemplary embodiment of the invention, a switch also includes a gate resistance topology connected between the gates and a control voltage. The gate resistance topology is used to minimize the effects of leakage current and reduce the resistor voltage drop for process points where FET diode leakage is an issue.

According to still another exemplary embodiment of the invention, a switch also includes a bypass resistance topology coupled across the FETs so as to be in parallel with each of the FETs. The bypass resistance topology is used to sharpen the control voltage of the switch. According to one embodiment, the bypass resistance topology includes a resistive element coupled across the entire switch (all of the FETs). According to one embodiment, a separate resistive element is coupled across each FET.

These and other features and embodiments of the invention will be more fully understood from the following detailed description that should be read in light of the accompanying drawings.

BRIEF DESCRIPTION OF THE DRAWINGS

The accompanying drawings, which are incorporated in and form a part of the specification, illustrate the exemplary embodiments of the present invention and, together with the description serve to explain the principles of the invention.

In the drawings.

DETAILED DESCRIPTION

Figure 2:
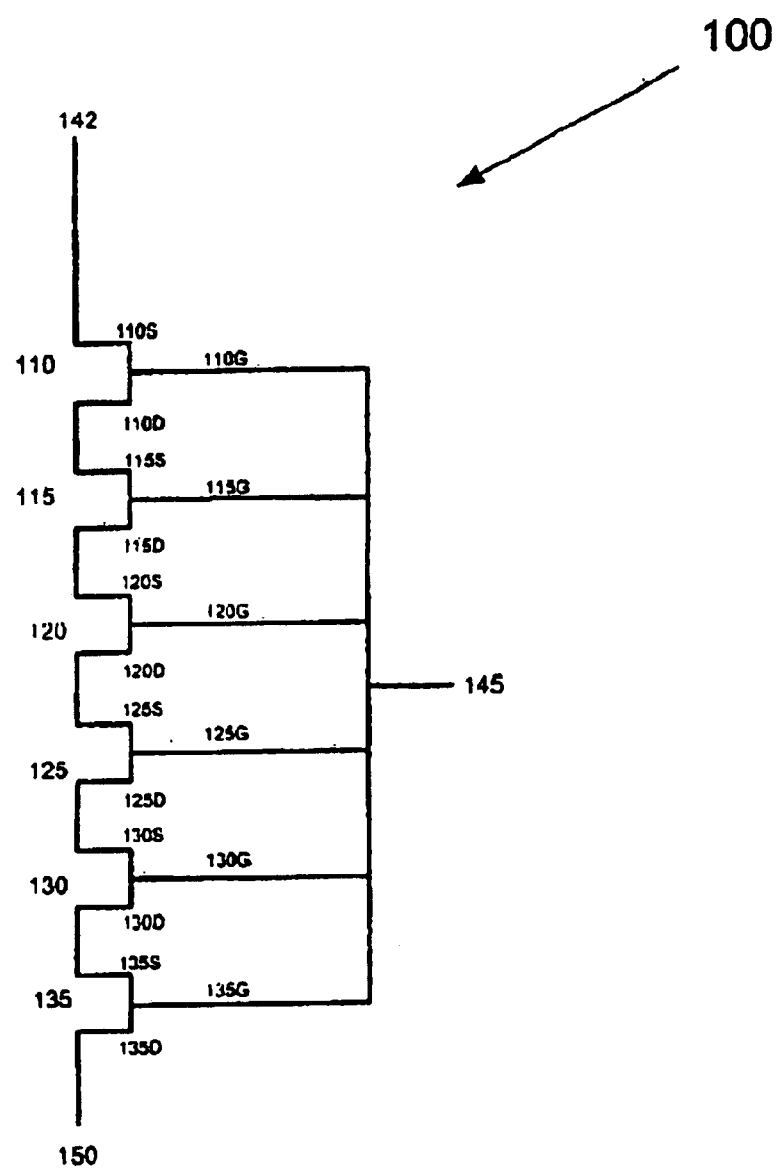
FIG. 2 illustrates an exemplary schematic diagram of a six-gate switch, according to one embodiment of the present invention.

FIG. 2 illustrates an exemplary schematic diagram of one embodiment of a switch 100 of the present invention. As illustrated, the switch 100 includes six field effect transistors (FETs) 110, 115, 120, 125, 130, and 135 connected together in series. Each FET has a source 110S–135S, a gate 110G–135G, and a drain 110D–135D. The drain of one FET is connected to the source of the next FET (i.e., drain 110D is connected to source 115S). The source 110S of the first FET 110 is connected to a source voltage input 142 that provides a source voltage for the switch 100. Each of the gates 110G–135G is coupled together and connected to a control voltage input 145 that provides a control voltage. The drain 135D of the sixth FET 135 is connected to an output 150 that will provide the current to a load. The use of six FETs, having six gates, allows the switch 100 operate at a low control voltage without the need to increase device periphery or die size.

The switch 100 is not limited to single gate FETs as illustrated in the exemplary embodiment of FIG. 2. Rather, the FETs utilized in the switch 100 can have any number of gates as long as the total number of gates equals six. For example, the switch 100 can utilize three dual gate FETs or two tri-gate FETS. In fact, the switch could utilize a mixed gate architecture where the FETs within the switch have different number of gates. For example, the switch could include three FETS, one having three gates, one having two gates and one having a single gate. As one of ordinary skill in the art would recognize there are multiple combinations of FETs that can be used to generate a switch having a total of six gates that would be within the scope of the current invention.

Figure 3:
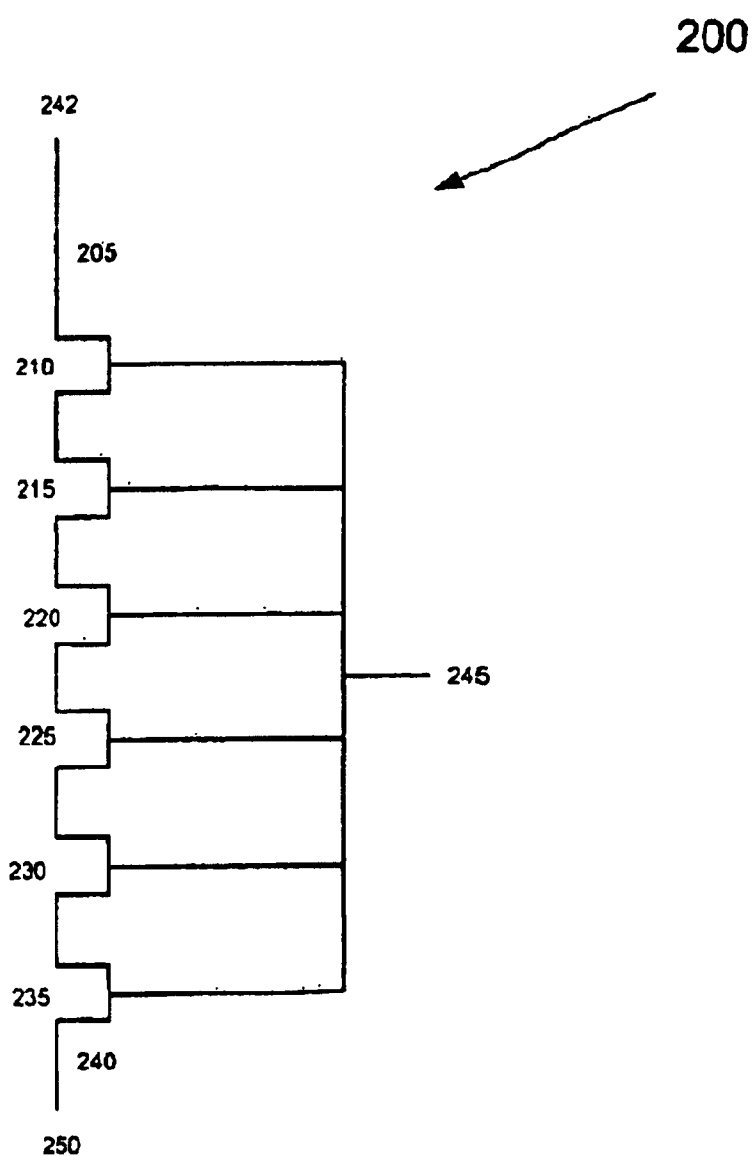
FIG. 3 illustrates an exemplary schematic diagram of a six-gate switch, according to one embodiment of the present invention.

FIG. 3 illustrates an exemplary schematic diagram of a switch 200, according to one embodiment of the current invention. The switch 200 includes six gates 210–235 that are clearly identified. However, the individual FETs that form the six gates are not identified as there are multiple different variations of FETs that can form the six gates. A first (uppermost or top) source 205 is connected to a source voltage input 242, each of the gates 210–235 is coupled together and connected to a control voltage input 245, and a last (lowermost or bottom) drain 240 is connected to an output 250.

Figure 4:
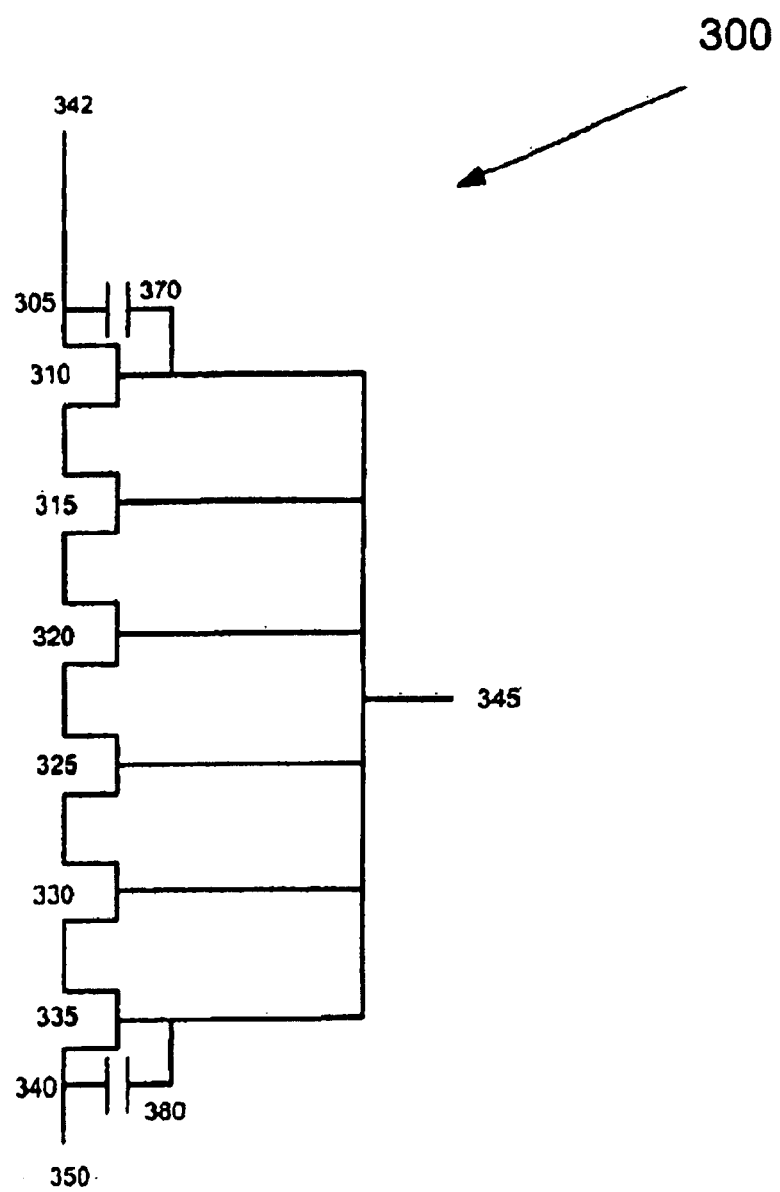
FIG. 4 illustrates an exemplary schematic diagram of a switch having feed-forward capacitors, according to one embodiment of the present invention.

FIG. 4 illustrates an exemplary schematic diagram of a switch 300, according to one embodiment of the present invention. The switch 300 is identical to the switch 200 with the addition of feed-forward capacitors 370, 380. The feed-forward capacitors 370, 380 are used to reduce signal distortion and improve the linearity and harmonic noise rejection characteristics of a FET. As illustrated, the switch 300 includes a first feed-forward capacitor 370 coupled between the uppermost source 305 and the gate 310 and a second feed-forward capacitor 380 coupled between the lowermost drain 340 and the gate 335.

As one of ordinary skill in the art would recognize, the feed-forward capacitors 370, 380 may include a capacitor bottom metal layer, a dielectric layer formed on the bottom layer, and a capacitor top metal layer formed on the dielectric layer. According to one embodiment, at least a portion of the top metal layer of the first feed forward capacitor 370 acts as the uppermost source 305, while at least a portion of the top metal layer of the second feed forward capacitor 380 acts as the lowermost drain 340. At least a portion of the gate 310 and at least a portion of gate 335 are connected to at least a portion of the capacitor bottom metal layer of the first capacitor 370 and the second capacitor 380 respectively.

According to one embodiment, the source and drain of each FET include fingers and the gates are located between the source fingers and the drain fingers. According to one embodiment, the gates are serpentine gates that wind between the source and drain fingers and are connected to the capacitor bottom metal layer (of the source or drain accordingly) at various points. Preferably the serpentine gates are connected to the capacitor bottom metal layer symmetrically. According to another embodiment, the gates of the FETs are buss gates that are directly connected to the capacitor bottom metal layer and protrude between source and drain fingers respectively. As one of ordinary skill in the art would recognize, there are other gate structures that are now known or are later discovered that would fall within the scope of the current invention. In multi gate FETs, the FETs may have a plurality of serpentine gates, a plurality of buss gates, a plurality of other gate types, or a combination thereof.

FIG. 4 illustrated an exemplary use of two feed-forward capacitors, one between the uppermost source and gate and one between the lowermost drain and gate, however, the invention is in no way intended to be limited thereto. Rather, other embodiments of the current invention could include more or less feed-forward capacitors, and the capacitors could be coupled to different FETs without departing from the scope of the current invention. For example, one embodiment could include in addition to the two feed forward capacitors of switch 300 a third feed-forward capacitor coupled between gate 325 and the associated source (or drain). Another embodiment, could include two feed-forward capacitors, one coupled between gate 315 and the associated source and one coupled between gate 330 and the associated drain.

Figure 5A:
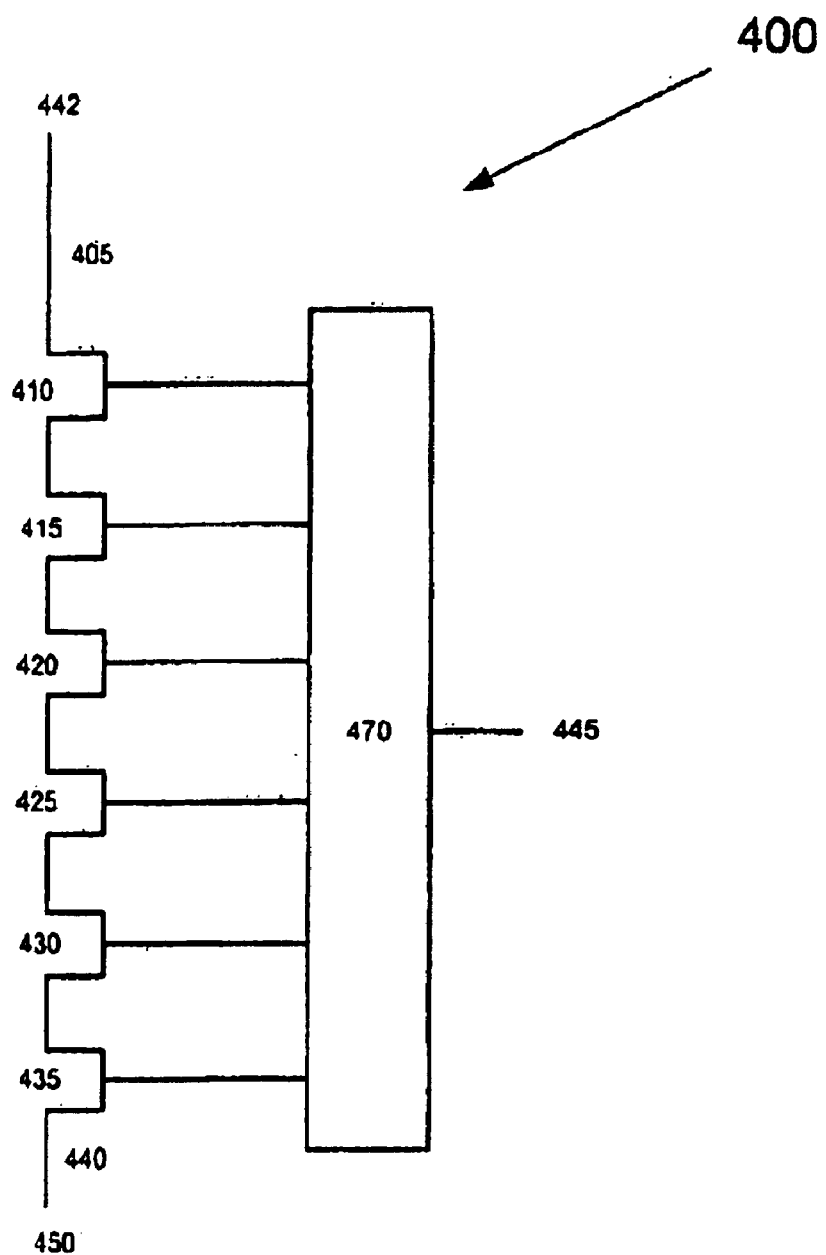
FIG. 5a illustrates an exemplary schematic diagram of a switch having a gate resistance topology, according to one embodiment of the present invention.

FIG. 5a illustrates an exemplary schematic diagram of a switch 400, according to one embodiment of the current invention. The switch 400 is identical to the switch 200 with the addition of a gate resistance topology 470. The gate resistance topology 470 is used to minimize the effects of leakage current and reduce the resistor voltage drop for process points where FET diode leakage is an issue. As illustrated, the gate resistance topology 470 is connected between each gate and the control voltage input 445, however, the current invention is not limited thereto. The gate resistance topology 470 could be coupled between only specific gates and the control voltage input 445 without departing from the scope of the current invention.

In a theoretical FET switch, no current flows (leaks) from the control voltage source to the gate of the FET or through the FET. However, in practice there is current leakage that flows from the control voltage source to the gate of FET and through the FET. Placing resistance (gate resistance topology) in the path between the control voltage source and the FET will limit the amount of leakage. As one skilled in the art would recognize, the higher the resistance placed in the path the lower the current. However, the higher the resistance the higher the voltage drop as well. Too much of a voltage drop could reduce the source control voltage to the point where the voltage applied to the gate is less than the pinch-off voltage needed to operate the switch. One of ordinary skill in the art of switch design would recognize how to balance the reduction of current and the voltage drop in such a way a to maximize the performance of the switch. There are numerous implementations of a gate resistance topology that fall within the scope of the current invention; some exemplary embodiments are disclosed herein.

Figure 5B:
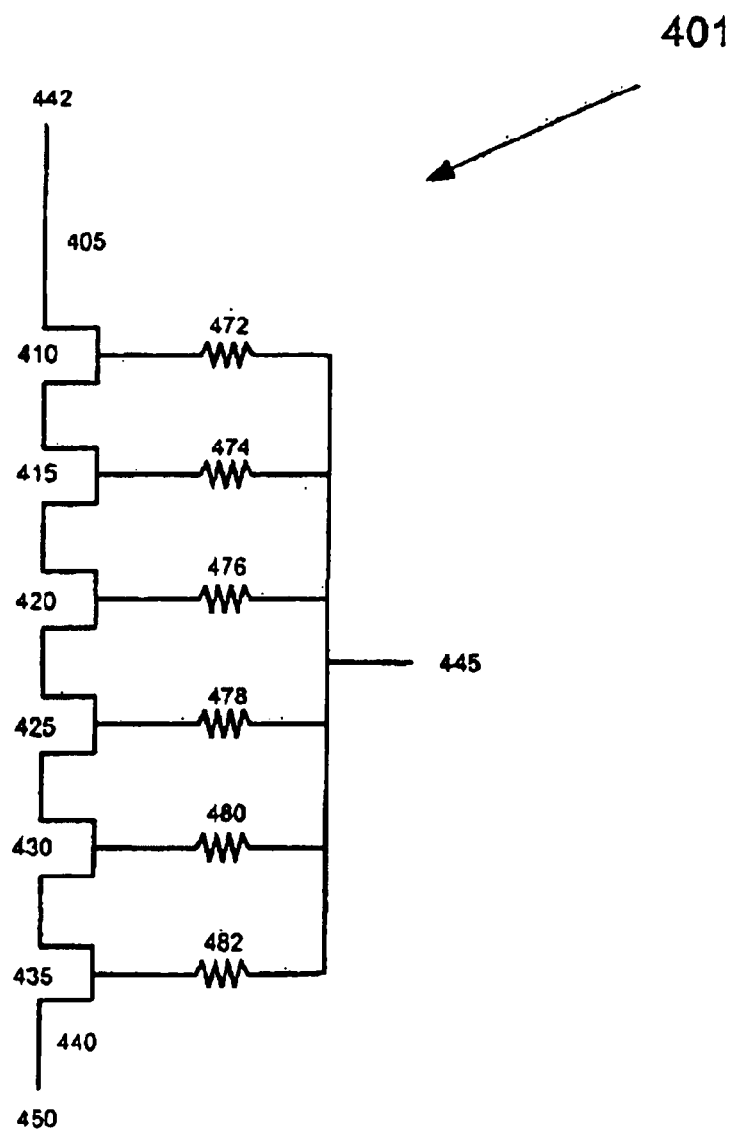
FIG. 5b illustrates an exemplary schematic diagram of a switch having a gate resistance topology, according to one embodiment of the present invention.

FIG. 5b illustrates an exemplary schematic diagram of a switch 401, according to one embodiment of the current invention. The switch 401 is identical to switch 400, with the exception that resistors (first resistors) 472–482 act as the gate resistance topology 470 and are connected between each gate 410–435 and the control voltage input 445. Each of the resistors 472–482 is in parallel with each other. The resistors 472–482 are illustrated as single resistors, however they are not limited thereto. Rather as one of ordinary skill in the art would recognize, the resistors 472–482 could include a plurality of resistors in series, could be any other type of resistive element, or could be a combination of same or different resistive types in series with one another without departing from the scope of the current invention.

According to one embodiment, each of the first resistors 472–482 has the same value and thus reduces the leakage current for each FET the same. However, as each FET does not necessarily have the same characteristics and each path from a FET to the control voltage input may not be the same, it is possible that the value of the resistors 472–482 will vary. One of ordinary skill in the art of switch design would know how to design the switch to take in account differences that may require different valued resistors 472–482.

Figure 5C:
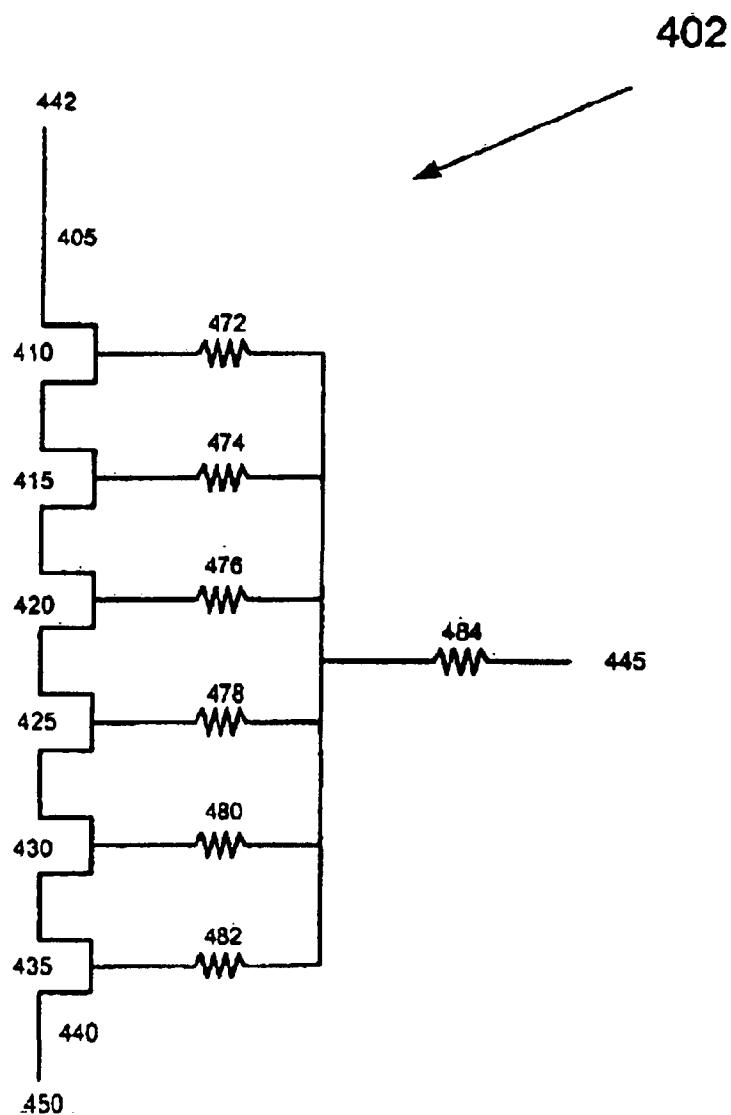
FIG. 5c illustrates an exemplary schematic diagram of a switch having a gate resistance topology, according to one embodiment of the present invention.

FIG. 5c illustrates an exemplary schematic diagram of a switch 402, according to one embodiment of the current invention. The switch 402 is identical to the switch 401, with the exception that a second resistor 484 is included in series with each of the first resistors 472–482. As previously discussed it should be noted that while all of the resistors of switch 402 are illustrated as single resistors, they are not limited thereto. Rather as one of ordinary skill in the art would recognize, each resistor could include a plurality of resistors in series, could be any other type of resistive element, or could be a combination of same or different resistive types in series with one another without departing from the scope of the current invention.

The addition of the second resistor 484 increases the overall resistance between control voltage input 445 and each of the gates 410–435 and thus reduces the control current applied to the gate. This type of embodiment may be used when it is not practical or beneficial to increase the value of each of the first resistors 472–482. However, the addition of the extra resistor adds an additional voltage drop point and thus an additional leakage process point. The addition of the additional leakage process point reduces the process stability of the switch as leakage through the resistor 484 could flow through each FET as that point is connected to all gates. As one of ordinary skill in the art would recognize, there is a tradeoff between lower leakage current and process stability.

Figure 5D:
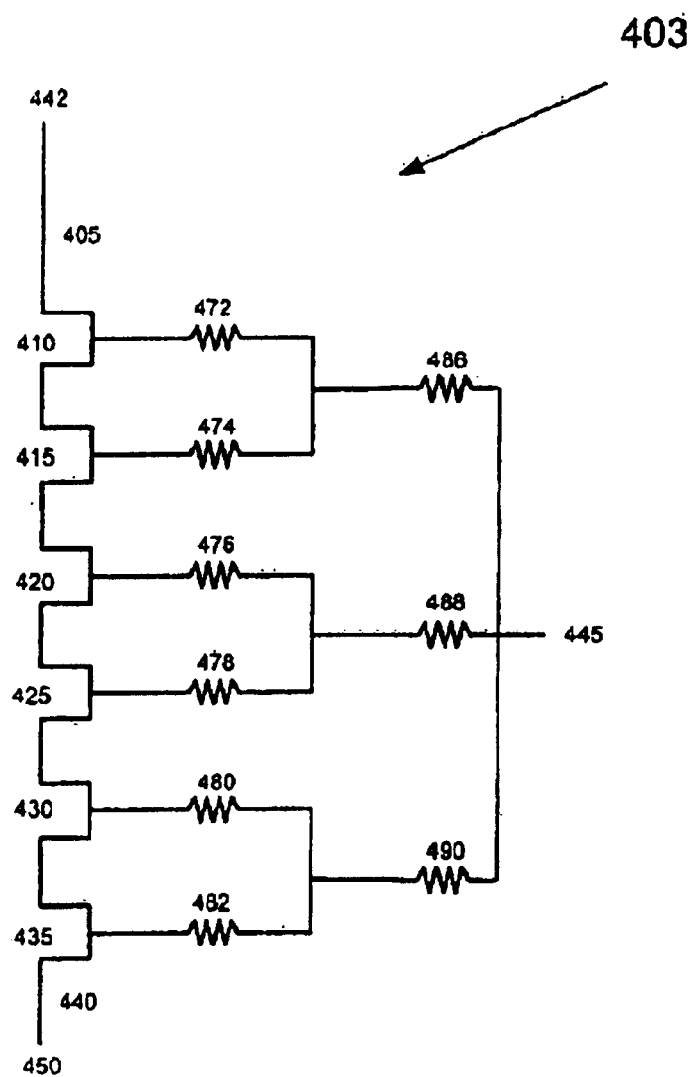
FIG. 5d illustrates an exemplary schematic diagram of a switch having a gate resistance topology, according to one embodiment of the present invention.

FIG. 5d illustrates an exemplary schematic diagram of switch 403, according to one embodiment of the present invention. The switch 403 is identical to the switch 401, with the exception that a plurality of second resistors 486–490 are included, each second resistor in series with a successive pair of first resistors (i.e., second resistor 486 in series with first resistors 472, 474). Each of the second resistors 486–490 is in parallel with each other. Moreover, each first resistor/second resistor path (i.e., 472/486) is in parallel with each other. As previously discussed it should be noted that while all of the resistors of switch 403 are illustrated as single resistors, they are not limited thereto. As with the embodiment of FIG. 5c, this type of embodiment may be used when it is not practical or beneficial to increase the value of each of the first resistors 472–482. The addition of the extra resistors 486–490 adds additional voltage drop points and thus an additional leakage process points. However, each additional leakage process point is only connected to two FETs so that any leakage through one of the second resistors 486–490 would only be promulgated to two FETs. Thus, this embodiment is more process stable than the embodiment illustrated in FIG. 5c. As one of ordinary skill in the art would recognize, there is a tradeoff between lower leakage current and process stability.

As previously discussed with respect to the first resistors 472–482, the second resistors 486–490 could all have the same resistance values, but are not limited thereto. Moreover, each series combination of first and second resistors (i.e., first resistor 472, second resistor 486 series resistance path) may have the same resistance value but are not limited thereto. One of ordinary skill in the art of switch design would recognize how to select the values of the resistors.

Figure 5E:
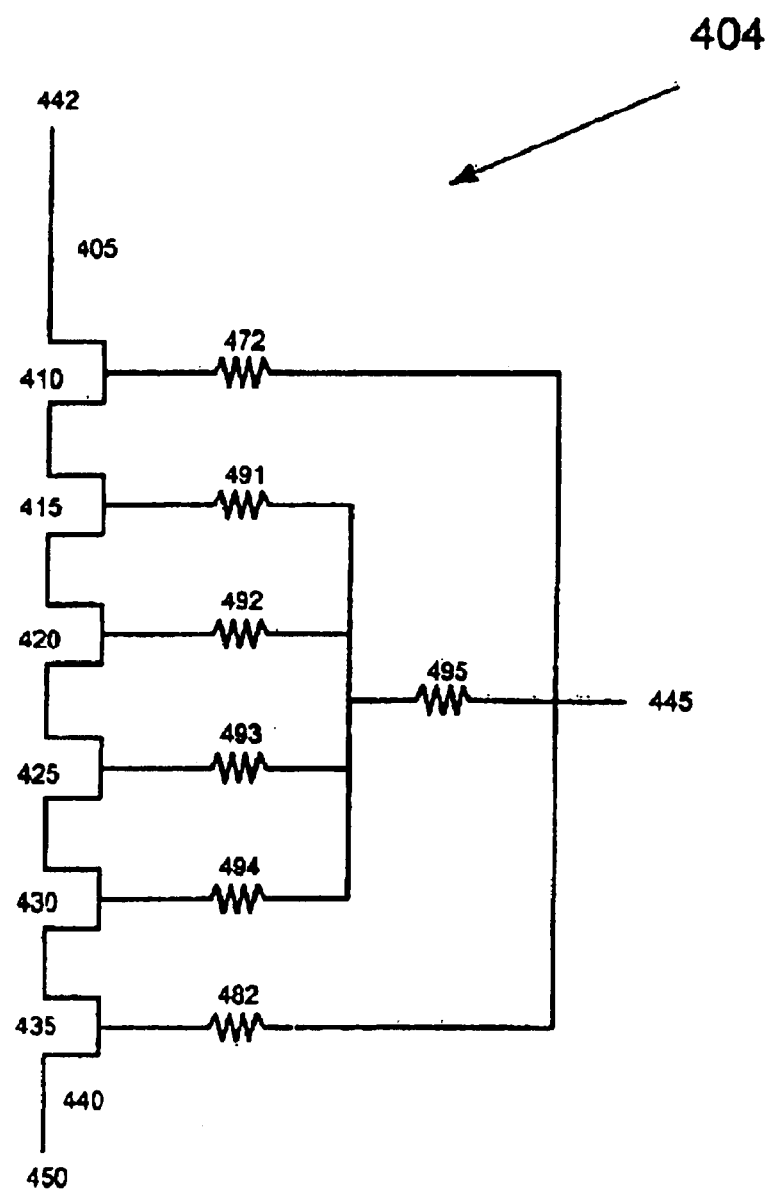
FIG. 5e illustrates an exemplary schematic diagram of a switch having a gate resistance topology, according to one embodiment of the present invention.

FIG. 5e illustrates an exemplary schematic diagram of switch 404, according to one embodiment of the present invention. The switch 404 includes the same gates 410–435, and the same source voltage input 442 and output 450 connections as all of the previously discussed embodiments of switches 400–403. The switch 404 also includes first resistors 472, 482, a plurality of second resistors 491–494, and a third resistor 495 in series with each of the second resistors 491–494. Each of the second resistors 491–494 is in parallel with each other, and the first resistors 472, 482 are in parallel with each of the second/third resistor paths (i.e., 491/495). As previously discussed it should be noted that while all of the resistors of switch 404 are illustrated as single resistors, they are not limited thereto. Furthermore, as previously discussed, the second resistors 491–494 could all have the same resistance values, but are not limited thereto. One of ordinary skill in the art of switch design would recognize how to select the values of the resistors.

The addition of the third resistor 495 to the second resistors 491–494 increase the resistance and thus reduces the leakage current for each of the gates 415–430. Utilizing resistors in series to increase the resistance is preferable when it is not practical or beneficial to increase the value of a single resistor. The addition of the third resistor 495 adds an additional voltage drop point and thus an additional leakage process point. The addition of the additional leakage process point reduces the process stability of the switch as leakage through the resistor 495 could flow through each FET connected thereto 410–430. As one of ordinary skill in the art would recognize, there is a tradeoff between lower leakage current and process stability.

According to one embodiment, the first resistors 472, 482 and the second resistors 491–494 have the same, or substantially the same, resistance values and the third resistor 495 increases the resistance and reduces the leakage current to the gates connected thereto (gates 410–430). One skilled in the art would understand the reasons why it would be desirable or beneficial to reduce the leakage current on certain FETs more than other FETs (as illustrated the inner FETS would have less leakage current than the uppermost and lowermost FETs).

According to one embodiment, the combination of second and third resistors (i.e., 491/495) have the same, or substantially the same, resistance values as the first resistors 472, 482. With each FET having the same, or substantially the same, resistance path the reduction in leakage should be the same, or substantially the same, for each FET. The middle FETs obtain their leakage reduction with the use of resistors in series, while the uppermost and lowermost FETs utilize a single resistor to obtain the leakage reduction. One skilled in the art would understand the reasons why it would be desirable or beneficial to reduce the leakage current on certain FETs using a single resistor and other FETS using multiple resistors in series (as illustrated the inner FETS use two resistors in series and the uppermost and lowermost FETs use a single resistor).

Figure 5F:
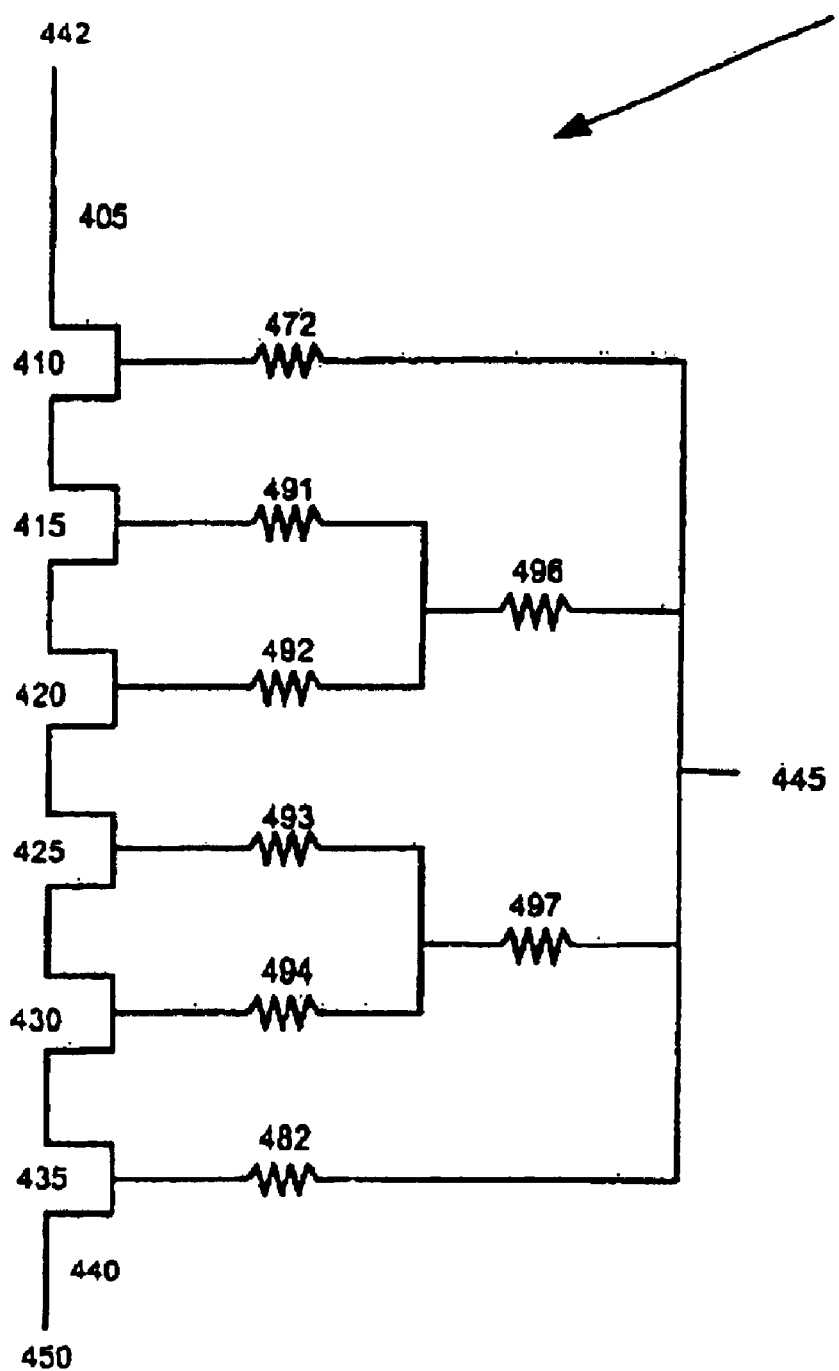
FIG. 5f illustrates an exemplary schematic diagram of a switch having a gate resistance topology, according to one embodiment of the present invention.

FIG. 5f illustrates an exemplary schematic diagram of switch 406, according to one embodiment of the present invention. The switch 406 is identical to the switch 404 with the exception that the third resistor 495 is replaced with two third resistors 496, 497. Each third resistor 496, 497 is coupled in series with each of two successive second resistors 491/492, 493/494 respectively. The resistors of switch 406 are illustrated as single resistors but are not limited thereto. The third resistors 496, 497 may have the same resistance value but are not limited thereto. Each third resistor 496, 497 adds an additional voltage drop point and potential leakage process point. However, each additional leakage process point is only connected to two FETs so that any leakage through one of the third resistors 496, 497 would only be promulgated to two FETs. Thus, this embodiment is more stable than the embodiment illustrated in FIG. 5e. As one of ordinary skill in the art would recognize, there is a tradeoff between lower leakage current and process stability.

FIGS. 5b–5f represent examples of embodiments of the gate resistance topology that could be utilized in the low control voltage switch of the current invention, and in no way should be construed to limit the invention thereby. Rather, as one of ordinary skill in the art would recognize there are numerous gate resistance topologies that would be well within the scope of the current invention.

Figure 6A:
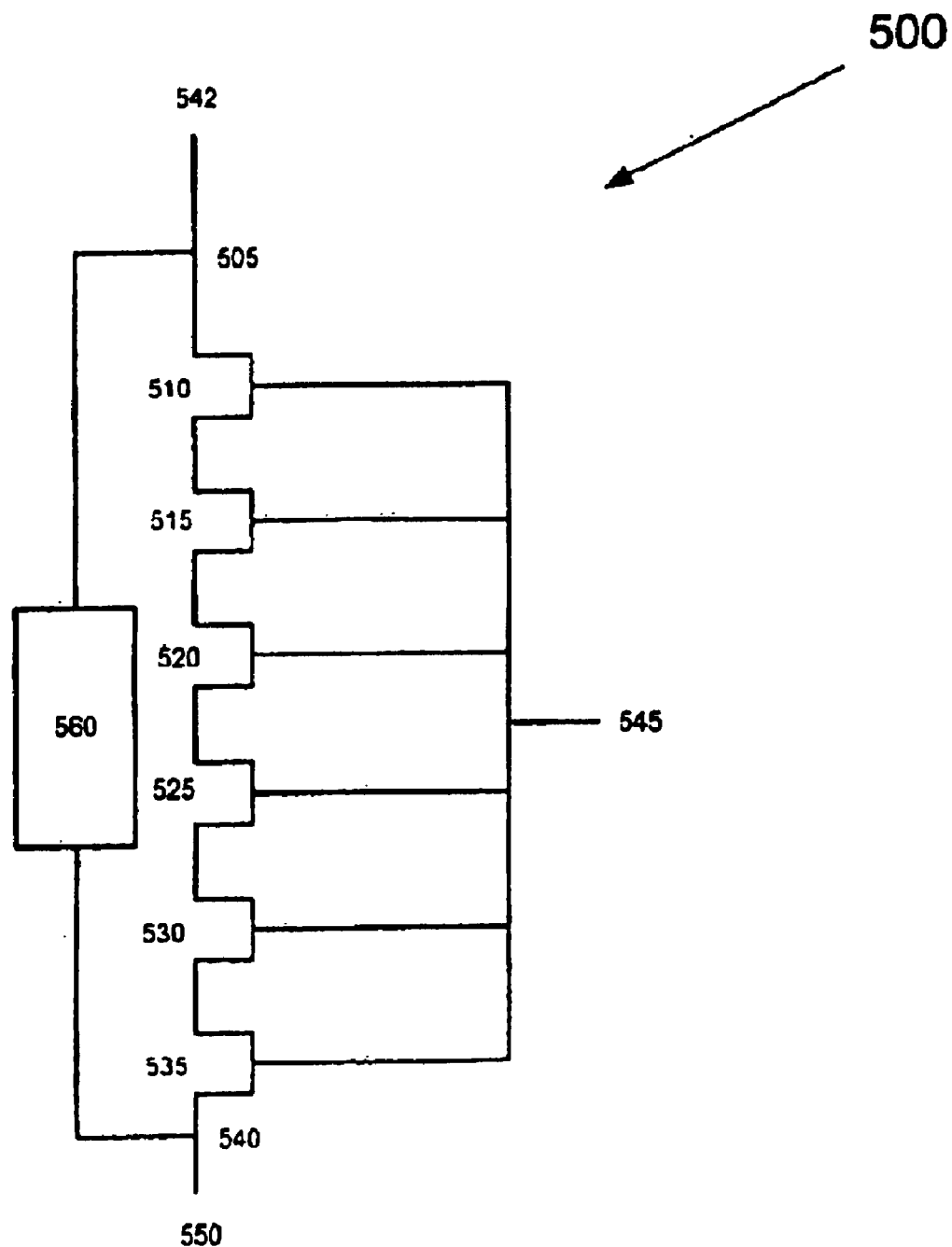
FIG. 6a illustrates an exemplary schematic diagram of a switch having a bypass resistance topology, according to one embodiment of the present invention.

FIG. 6a illustrates an exemplary schematic diagram of a switch 500, according to one embodiment of the present invention. The switch 500 includes a total of six gates 510–535, a first source 505 is connected to a source voltage input 542, and a last drain 540 is connected to an output 550. The switch 500 also includes a bypass resistance topology 560 coupled between the source voltage input 542 (first source 505) and the output 550 (last drain 540) so as to be coupled across (in parallel to) each of the FETs.

Figure 1A:
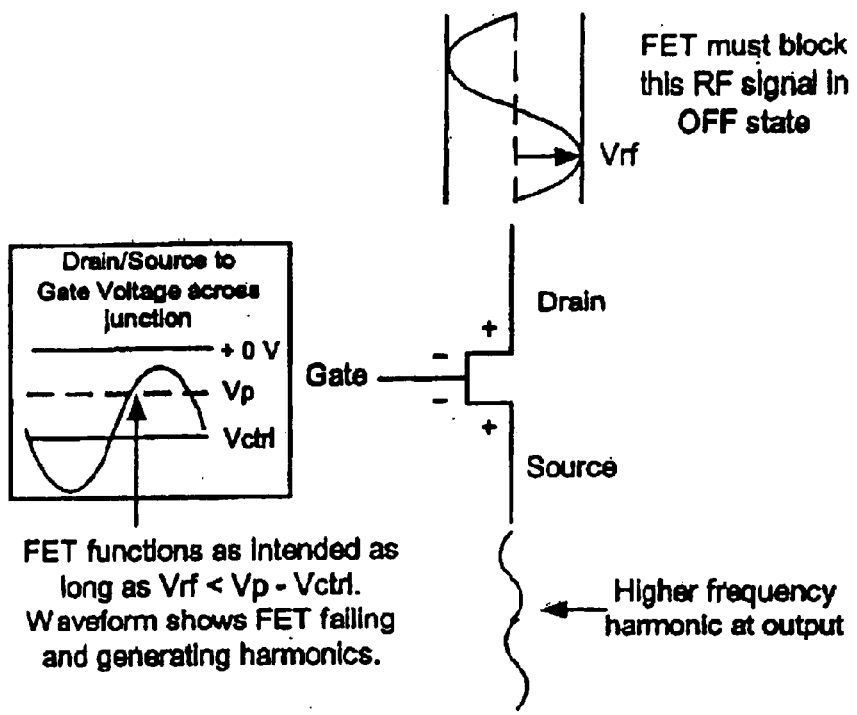
FIG. 1a is an exemplary embodiment illustrating the operation of a prior art FET.
Figure 1B:
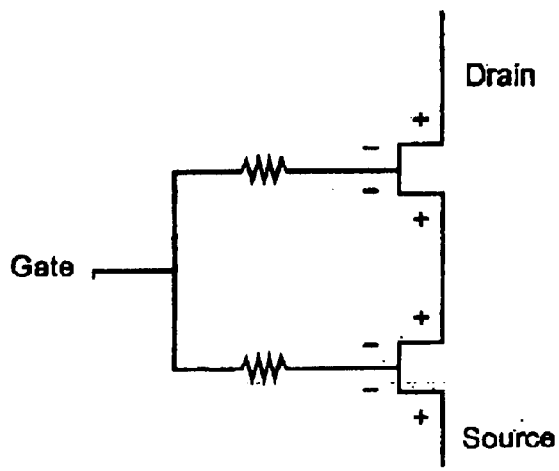
FIG. 1b is another exemplary embodiment illustrating the operation of a prior art FET.

As discussed above, a theoretical (ideal) switch provides no output until the pinch-off voltage is attained. However, in practice the switch does not have a precise turn on time and instead starts to turn on prior to the pinch-off voltage being applied (see 1130 of FIG. 1). The use of the bypass resistance topology 560 in parallel to the FETs increases the precision timing of the switch activation (i.e., sharpen the control voltage). The bypass resistance topology 560 provides a known resistive path between the source voltage input 542 and the output 550 (in parallel to the FETs). The bypass resistance topology 560 has a resistance that is less than the resistance of the FETs in an OFF state (theoretically infinite) but more that the FETs in an ON state. The selection of the resistance in this range allows the bypass resistance topology 560 to control the flow of current.

When the switch is in an OFF state, the bypass resistance topology 560 produces a known current flow (in effect a known leakage current) through that path. As the control voltage is increased towards the pinch-off voltage, the resistance of the FET starts to be reduced. This reduction in resistance of the FET would normally lead to increased leakage current or partial switch activation prior to the pinch-off current being reached. However, the bypass resistance topology 560 limits (and ideally prevents) the current from flowing through the FETs until a point when the resistance of the FETs is less that the resistance of the bypass resistance topology 560. In effect, the bypass resistance topology 560 is limiting (or preventing) current from flowing through the FETs until the FETs are closer to reaching the pinch-off voltage and turning ON. Thus, the bypass resistance topology 560 increases the precision timing of switch activation by sharpening the control voltage.

Figure 6B:
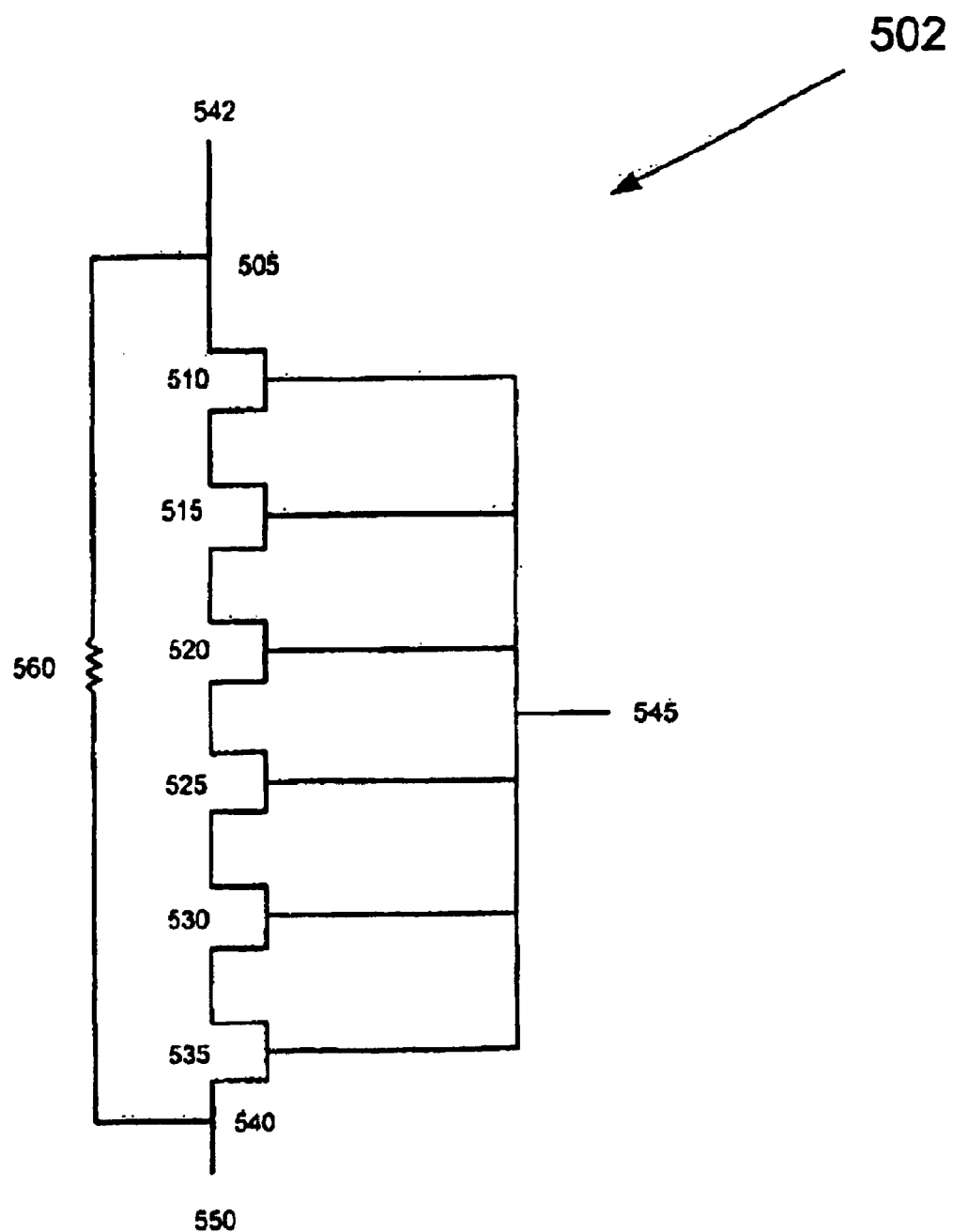
FIG. 6b illustrates an exemplary schematic diagram of a switch having a bypass resistance topology, according to one embodiment of the present invention.
Figure 6C:
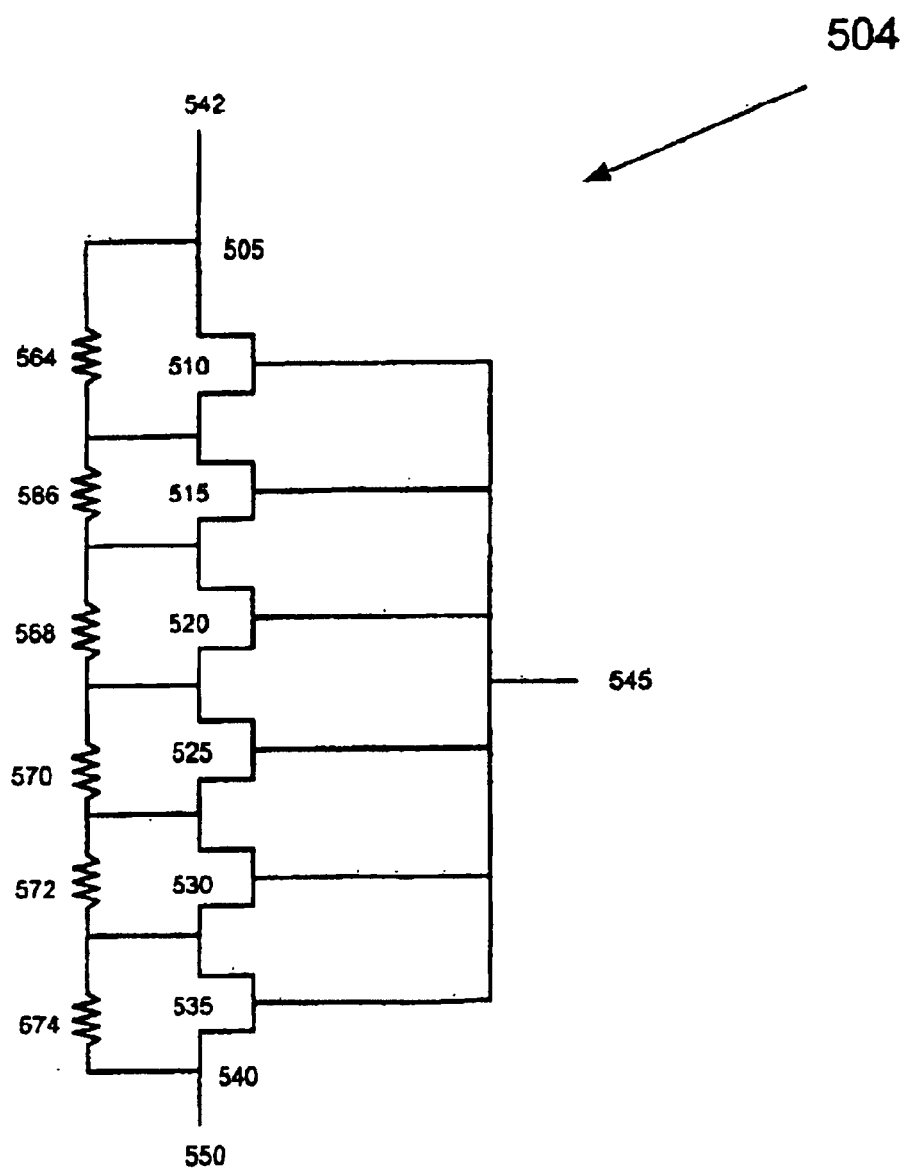
FIG. 6c illustrates an exemplary schematic diagram of a switch having a bypass resistance topology, according to one embodiment of the present invention.
Figure 6D:
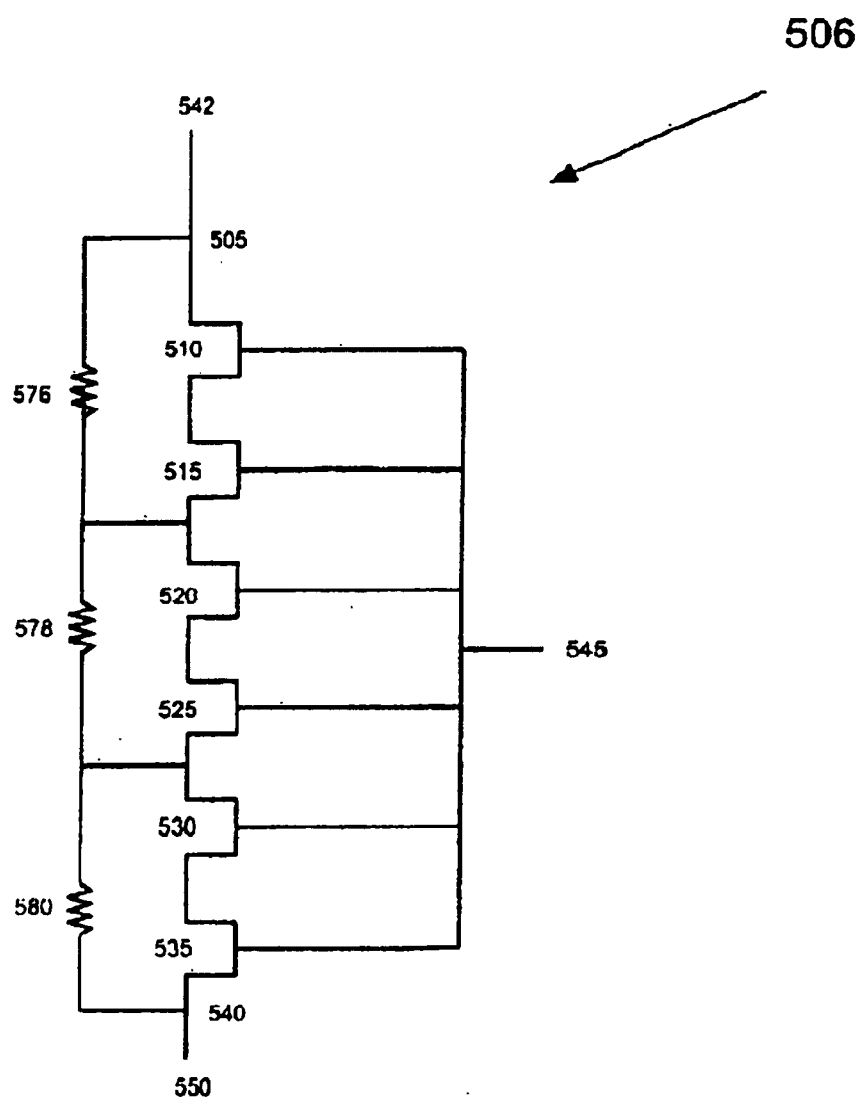
FIG. 6d illustrates an exemplary schematic diagram of a switch having a bypass resistance topology, according to one embodiment of the present invention.

As illustrated, the bypass resistance topology 560 is coupled between the source voltage input 542 and the output so as to be in parallel-with all of the FETs, however, the invention is not intended to be limited thereto. Rather, there are numerous implementations of a bypass resistance topology that fall within the scope of the current invention. FIGS. 6b–6d that follow will illustrate several exemplary embodiments.

FIG. 6b illustrates an exemplary schematic diagram of a switch 502, according to one embodiment of the current invention. The switch 502 is identical to switch 500 with the exception that a resistor 562 (acts as the bypass resistance topology) is coupled in parallel to all the FETs (gates 510–535) from the source voltage input 542 (first source 505) to the output 550 (last drain 540). The resistor 562 is illustrated as a single resistor, however it is not limited thereto. Rather as one of ordinary skill in the art would recognize, the resistor 562 could include a plurality of resistors in series, could be any other type of resistive element, or could be a combination of same or different resistive types in series with one another without departing from the scope of the current invention.

As previously discussed, the resistor 562 (bypass resistance topology) limits the output (current) of the switch prior to the control voltage reaching the pinch-off value. The use of the resistor 562 focuses the increase of precision activation timing on the whole switch 502 instead of the individual FETs making up the switch (linearity is not an issue). One preferred implementation of the exemplary embodiment of FIG. 6b is for devices that do not require high linearity from switches utilized therein. Since the linearity of the switch, and each of the FETs that make up the switch, is not a critical issue one bypass resistor can be used to sharpen the control voltage of the overall switch 502. Another preferred implementation of this embodiment is for devices that require high power switches that will output a relatively large current once the switch is activated. The use of a relatively large resistor 562 will limit (and ideally prevent) the switch from outputting a large current until the control voltage reaches the pinch-off value and each of the FETs and the switch 502 is activated.

Accordingly, the exemplary switch 502 can be used in devices where a high power output may be desired, such as GSM devices. However, the use of the switch 502 in a particular device or for a particular application is based on more than just the type of bypass resistance topology that is used. The use of the switch also depends on other fractures, including but not limited to, the characteristics of the FETs, the number of FETs, and the source voltage supplied. Thus, as one skilled in the art would recognize, the switch 502 is not limited to high power devices and can be used in any now known or later discovered device where a solid-state switch is required, such as high frequency signal transmission systems, including but not limited to Wireless LAN, Bluetooth, CDMA, TDMA, GSM and W-CDMA.

FIG. 6c illustrates an exemplary schematic diagram of a switch 504, according to one embodiment of the current invention. The switch 504 is identical to the switch 500 of FIG. 6a with the exception that switch 504 includes a plurality of resistors 564–574 (bypass resistance topology), with one resistor coupled across (in parallel to) each FET. The resistors 564–574 are illustrated as single resistors, however they are not limited thereto. Rather as one of ordinary skill in the art would recognize, the resistors 564–574 could include a plurality of resistors in series, could be any other type of resistive element, or could be a combination of same or different resistive types in series with one another without departing from the scope of the current invention. The use of the resistors 564–574 for each single-gate FET focuses the increase of precision activation timing on each individual FET included in the switch (high linearity).

In one preferred embodiment, each of the FETs of the switch 504 has the same or substantially the same performance characteristics, so that they theoretically function in the same manner (identical characteristics, such as activation timing and leakage). As one skilled in the art would recognize, however, in reality each FET will likely have slightly different characteristics due to different variables, including the processing of the chip. However, these differences of characteristics are normally relatively small or negligible and cannot be accounted for prior to processing. Thus, according to one embodiment of the invention, each resistor 564–574 has the same resistance value so as to maintain linearity between each of the FETs.

However, it should be understood that embodiments are not limited to resistors 564–574 having the same value. In some embodiments it may be desirable or necessary to utilize different valued resistors. For example, if the characteristics of the FETs where not the same, for some reason, the bypass resistors could be selected so as to increase the linearity of the different FETs. Potential reasons for the FETs having different characteristics may include the location of the FET on the chip, the processing of the chip, the design of the switch, the distance from the source voltage or control voltage, other devices (i.e., feed-forward capacitors) connected to the FET, or inherent resistance in the board. For example, if it was known that a FET produced on a certain location of the chip had slightly different characteristics, a different value resistor may be used to reduce or eliminate the differences and maintain linearity. Another example may be that the path between a certain source and drain had a different resistance value due to, for example, length of path so that more or less resistance could be used to account for the difference. As one of ordinary skill in the art would recognize there are multiple scenarios that could cause a switch designer to use varying value resistors in the design of switches utilizing bypass resistors in the manner captured by the embodiment of FIG. 6c.

One preferred implementation of the exemplary embodiment of FIG. 6c is for devices that require high linearity from switches utilized therein. Since the linearity of the switch, and each of the FETs that make up the switch, is important, individual resistors coupled across (in parallel to) each FET assist in decreasing (and ideally removing) the differences in performance (activation timing) of each of the individual FETs by increasing the precision timing of the activation of each FET (switch turn on) and thus the linearity of the switch 504. Another preferred implementation of this embodiment is for devices that require low power switches that will output a relatively low current once the switch is activated. As the power produced by the switch is lower, use of relatively small resistors 564–574 can increase the precision timing of each FET and the switch 504, so as to limit (and ideally prevent) the output of a low powered switch (low output current) until the control voltage reaches the pinch-off level and each of the FETs and the switch 504 is activated.

Accordingly, the exemplary switch 504 can be used for devices where low power is desired, such as CDMA devices. However, the use of the switch 504 in a particular device or for a particular application is based on more than just the type of bypass resistance topology that is used. The use of the switch also depends on other fractures, including but not limited to, the characteristics of the FETs, the number of FETs, and the source voltage supplied. Thus, as one skilled in the art would recognize, the switch 504 is not limited to low power devices and can be used in any now known or later discovered device where a solid-state switch is required, such as high frequency signal transmission systems including Wireless LAN, Bluetooth, CDMA, TDMA, GSM and W-CDMA.

FIG. 6d illustrates an exemplary schematic diagram of a switch 506, according to one embodiment of the current invention. The switch 506 is identical to the switch 504 of FIG. 6c with the exception that switch 506 includes a plurality of resistors 576–580 (bypass resistance topology), with one resistor coupled across (in parallel to) each FET. As illustrated, the switch 506 has three dual-gate FETs with one resistor coupled across each dual-gate FET of the switch 506. It should be noted that the invention is not limited to the illustrated three dual-gate FETs, as previously discussed other embodiments of the current invention may include switches having any number of FETs having a total of six gates. Rather, this embodiment is illustrating that a resistor may be coupled in parallel to each multi-gate FET of a switch.

The resistors 576–580 are illustrated as single resistors, however they are not limited thereto. Rather as one of ordinary skill in the art would recognize, the resistors 576–580 could include a plurality of resistors in series, could be any other type of resistive element, or could be a combination of same or different resistive types in series with one another without departing from the scope of the current invention. As mentioned above the resistors 576–580 may have the same values but are not limited thereto. The embodiment of FIG. 6d can be used in the same devices or for the same applications as those mentioned above with respect to FIG. 6c. However, utilizing multi-gate FETs will allow this embodiment to have a smaller die size then the embodiment illustrated in FIG. 6c.

FIGS. 6a–6d illustrated various exemplary embodiments of resistors used as a bypass path to sharpen the control voltage of the switch and increase the precise timing of the switch activation. All of the embodiments illustrated in these figures have a parallel path for either each FET or the entire series of FETs making up the switch. The invention is in no way intended to be limited thereto. Rather any combination of resistors can be used on any combination of FETs without departing from the scope of the current invention. For example, a resistor may be used as a bypass path for any subset of successive FETs used in the switch (i.e., single resistor coupled in parallel to FETs having gates 515–530), or resistors may to used as a bypass path for any combination of FETs used in the switch (i.e., a first resistor in parallel to FETs having gates 515 and 520, and a second resistor in parallel to FET having gate 535).

FIGS. 4, 5a–f and 6a–d illustrate the independent addition of feed-forward capacitors (370, 380 in FIG. 4), gate resistance topology (i.e., 470 in FIG. 5), and bypass resistance topology (i.e., 560 in FIG. 6) respectively to six gate switches. However, this is in no way intended to limit the scope of the invention. For example, feed-forward capacitors (any embodiment thereof), gate resistance topology (any embodiment thereof), and bypass resistance topology (any embodiment thereof) may be added to a six-gate switch in any combination. As one skilled in the art would recognize, there are a plurality of combinations that would be well within the scope of the present invention. Each different embodiment potentially being used in a different device or for a different purpose.

As previously discussed, FET switches are often utilized in communication devices, and are the preferred type of switch for high frequency signal transmission systems, such as Wireless LAN, Bluetooth, CDMA, TDMA, GSM and W-CDMA. Most high frequency signal transmission devices are continuing to get smaller while at the same time adding additional functions. Utilizing various embodiments of the current invention at the same time can produce an enhanced switch that does not require additional device periphery or die size (and preferably would reduce the die size). For example, utilizing a bypass resistance topology, feed-forward capacitors, a gate resistance topology and six-gates as discussed with respect to various embodiments of the current invention would produce a switch that had a low control voltage, sharpened control voltage (more precise activation timing) and less harmonics on the output. The function of the switch, such as whether the switch is high poweror low power or other variations that would be known to those of ordinary skill in the art, dictates the precise design of the switch. As one skilled in the art knows the precise design of the chip includes, amongst other things, number, type and size of FETs, location of FETs and other periphery, bypass resistance topology, and gate resistance topology.

As one skilled in the art knows,.different communication devices utilize different standards. Each of the standards may operate at different frequencies and/or using different protocols to transmit data. Each of the different communication standards therefore requires different characteristics out of the switches used in communication devices utilizing that standard. For example with respect to the GSM communication standard, linearity refers to maximum power handling without distortion,. In contract, with the CDMA communication standard, linearity refers to minimizing distortion of two low power signals traveling simultaneously in the same arm of a switch without generating any intermodulation distortion.

Figure 7:
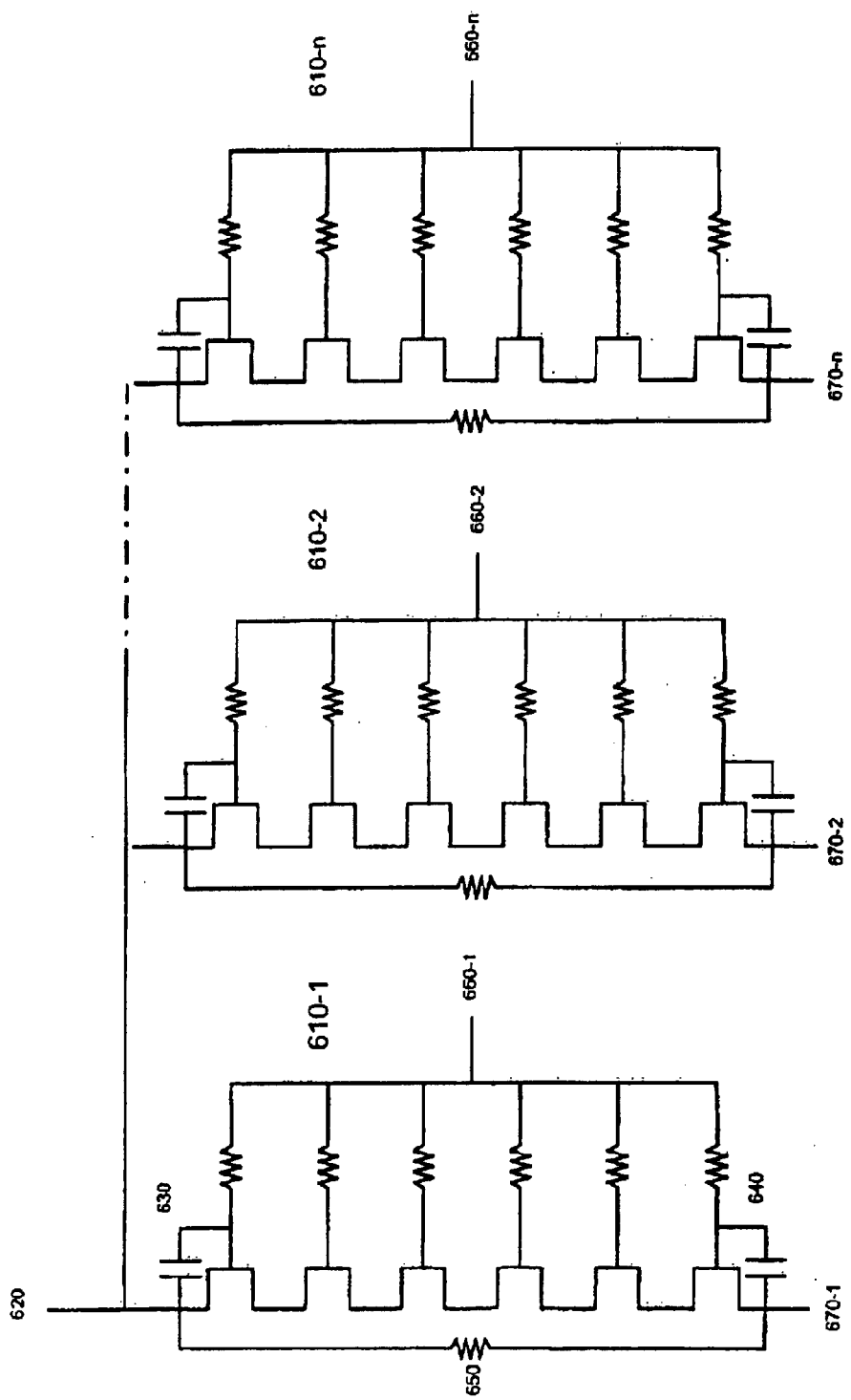
FIG. 7 illustrates an exemplary schematic diagram of a device having multiple switches in parallel, according to one embodiment of the present invention.

FIG. 7 illustrates an exemplary schematic diagram of a device 600, such as a GSM device, which provides for maximum power handling without distortion. The device 600 includes a plurality of switches $610_{(1-n)}$. Each of the switches 610 is in parallel with each other and is connected to same source voltage 620. Each switch 610 includes FETs having a total of six gates (single, multi or mixed gate FETs), a first feed-forward capacitor 630 connected to a first gate and an uppermost source, a second feed-forward capacitor 640 connected to a sixth gate and a lowermost drain, a single bypass resistor 650, and a single gate resistor (gate resistance topology) coupled between each gate and a control voltage 660. Each switch 610 is provided with its own control voltage 660 (or connects to the same control voltage via a separate controllable path) and produces its own output 670. The utilization of a single bypass resistor 650 indicates that the switches are high power switches, as single bypass resistors are utilized to sharpen the control voltage and increase the activation efficiency of high-powered switches (see previous disclosure related to FIG. 6b).

As one of ordinary skill in the art would recognize, there are multiple other embodiments of switches that could be used in devices requiring high power switches that would be well within the scope of the current invention. For example, different gate resistor topologies could be used. Furthermore, the devices are not limited to the illustrated configuration where all of the switches are in parallel and are connected to the same control source. For example, the plurality of switches could be connected to the same control voltage source, or the plurality of switches could be connected to separate source voltage sources.

Figure 8:
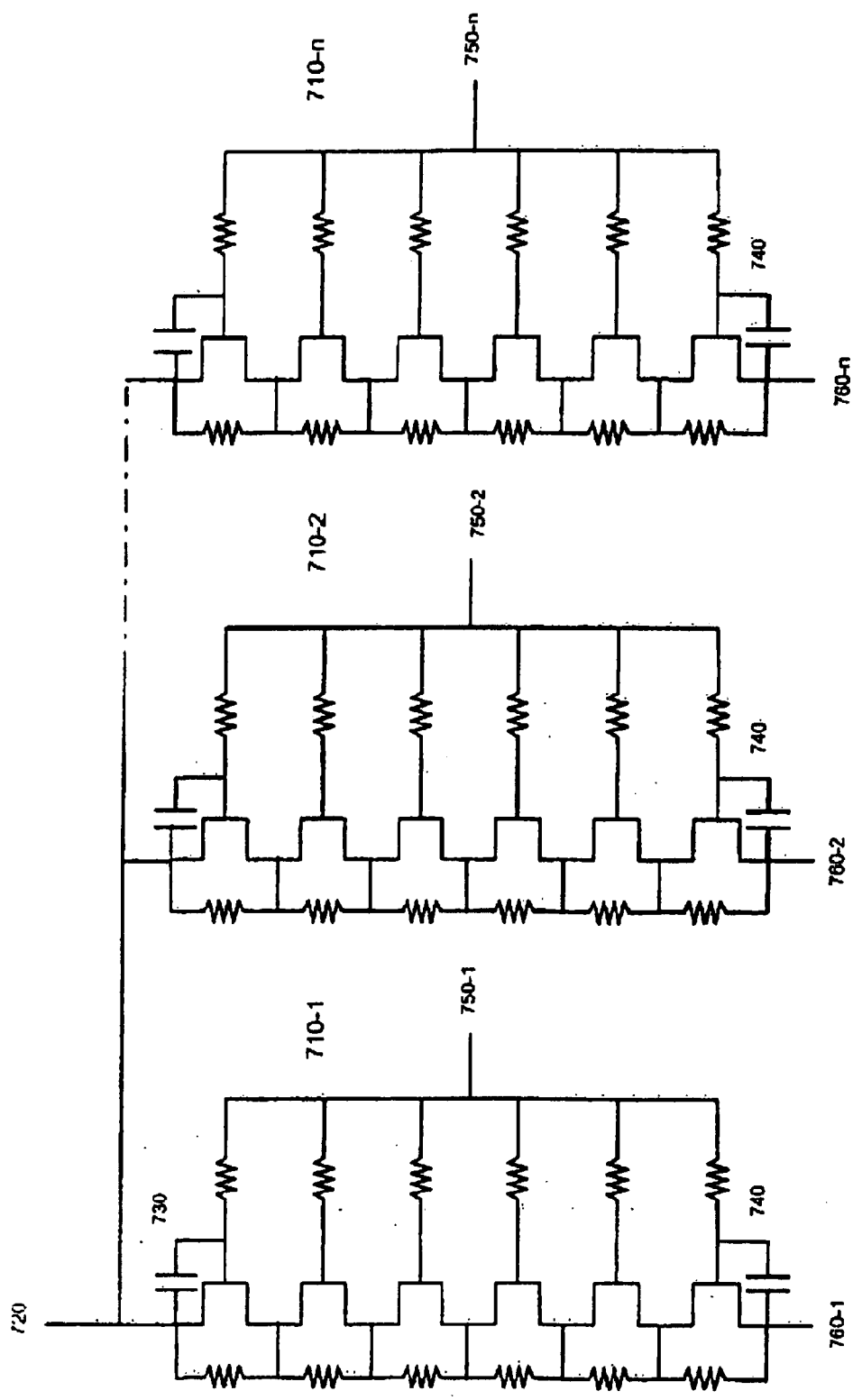
FIG. 8 illustrates an exemplary schematic diagram of a device having multiple switches in parallel, according to one embodiment of the present invention.

FIG. 8 illustrates an exemplary schematic diagram of a device 700, such as CDMA device, requiring low power. The device 700 includes a plurality of switches $710_{(1-n)}$. Each of the switches 710 is in parallel with each other and is connected to same source voltage 720. Each switch 710 includes a plurality of FETs (illustrated as single gate FETs), a first feed-forward capacitor 730 connected to a first gate and an uppermost source, a second feed-forward capacitor 740 connected to a sixth gate and a lowermost drain, a bypass resistor coupled across each FET, and a single resistor (gate resistance topology) coupled between each gate and a control voltage 750. Each switch 710 is provided with its own control voltage 750 and produces its own output 760. The utilization of a single bypass resistor for each FET provides that the switches are high linearity switches, as single bypass resistors are utilized to sharpen the control voltage and increase the activation efficiency of each individual FET within the switch (see previous disclosure related to FIGS. 6c and 5d).

As one of ordinary skill in the art would recognize, there are multiple other embodiments of switches that could be used in devices requiring high linearity switches that would be well within the scope of the current invention. For example, different gate resistor topologies could be used or multi-gate FETs could be used. Furthermore, the devices are not limited to the illustrated configuration where all of the switches are in parallel and are connected to the same control source. For example, the plurality of switches could be connected to the same control voltage source or each or the plurality of switches could be connected to separate source voltage sources.

FIG. 7 illustrates a device requiring high power switches and FIG. 8 illustrates a device requiring high linearity switches. As illustrated, the devices 600, 700 used a plurality of identical switches $610_{(1-n)}$, $710_{(1-n)}$. The invention should not be construed to be limited thereby. The devices 600, 700 could utilize a variety of different type of switches as long as the switch fit the purpose of the device. For example, a device requiring three high power switches could utilize a first high-power switch having single gate FETS and a single resistor in parallel from a gate of each FET to a control voltage source (i.e., as illustrated in the exemplary switch 401 of FIG. 5b), a second high-power switch utilizing dual gate FETs and a single resistor in parallel from the gate of each FET to the control voltage source (i.e., switch 401), and a third high-power switch having dual gate FETs and a plurality of resisters in parallel from the gate of each FET to the control voltage source (i.e., as illustrated in exemplary switches 402, 403 of FIGS. 5c–5d).

Furthermore, the invention is not limited to devices (such as devices 600, 700) that require only one type of switch (i.e., high power, low power). Rather, as one skilled in the art would recognize a device could have multiple different types of switches without departing from the scope of the current invention. For example, a device may have both high power and lower switches contained therein.

Figure 9:
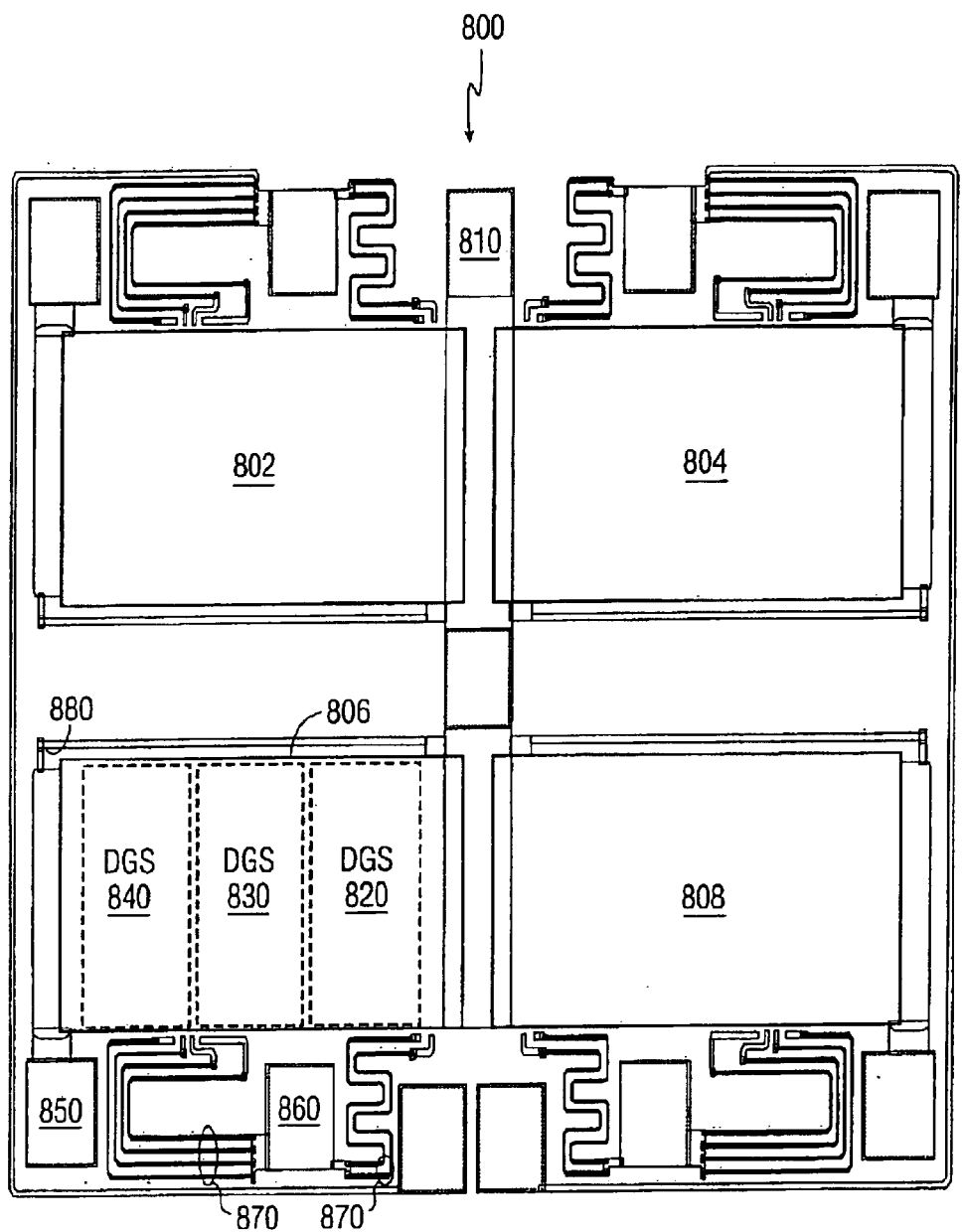
FIG. 9 illustrates an exemplary chip layout design having a plurality of switches, according to one embodiment of the present invention.
Figure 9A:
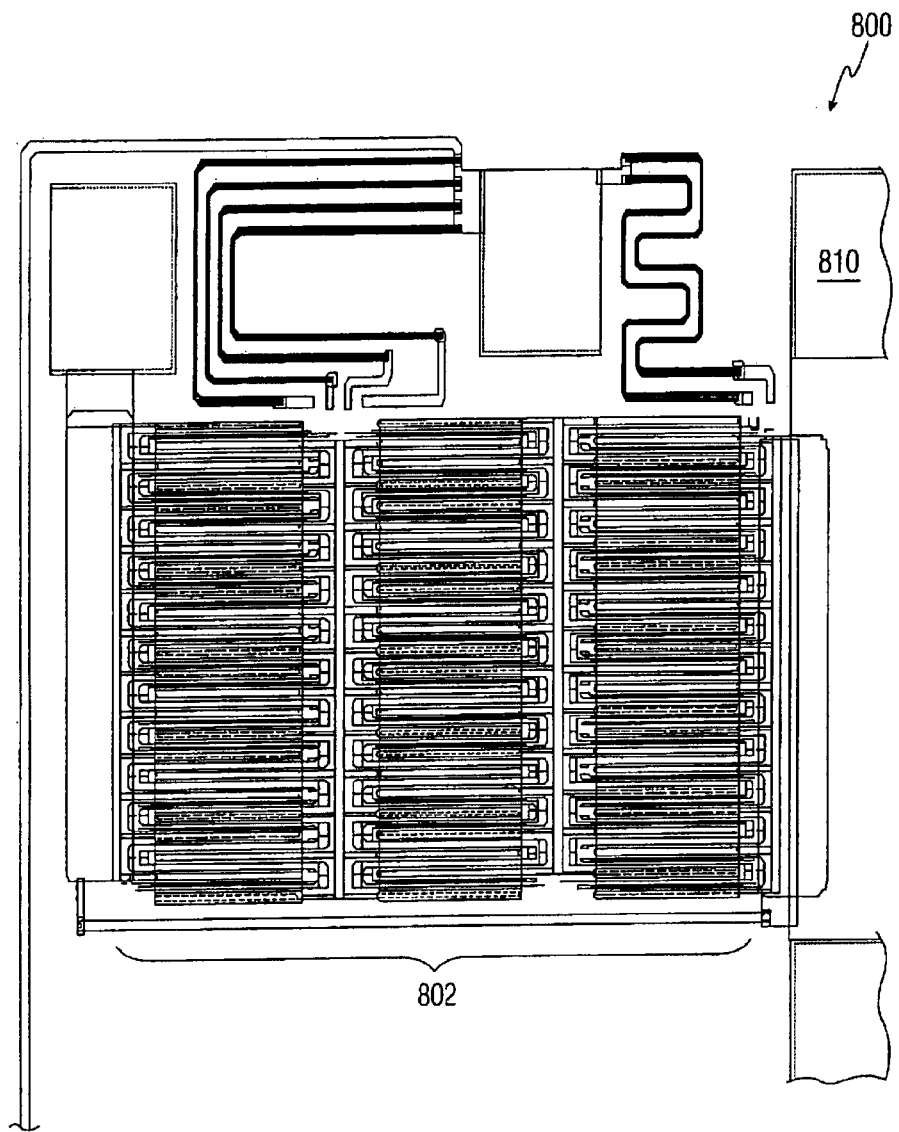
Figure 9B:
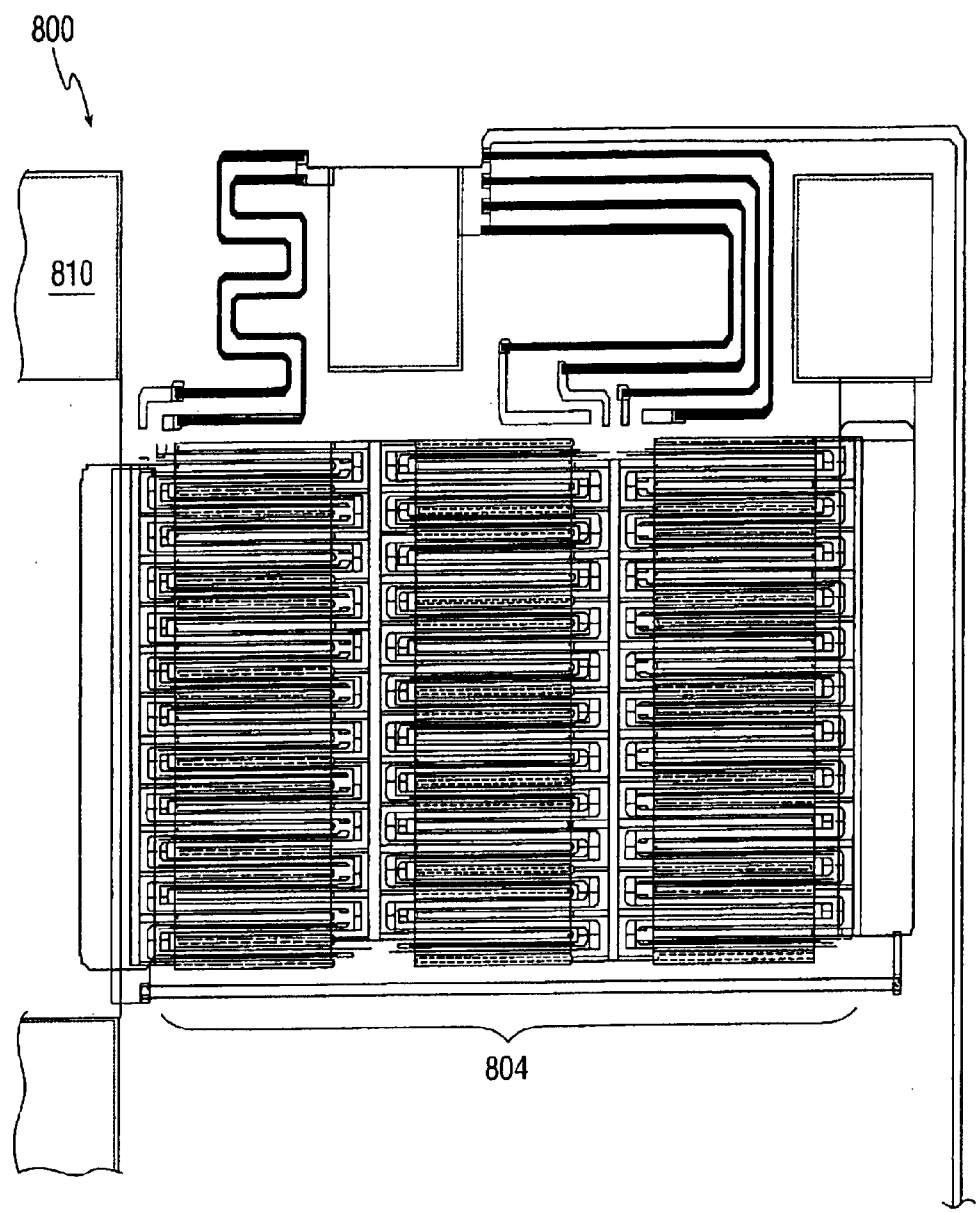
Figure 9C:
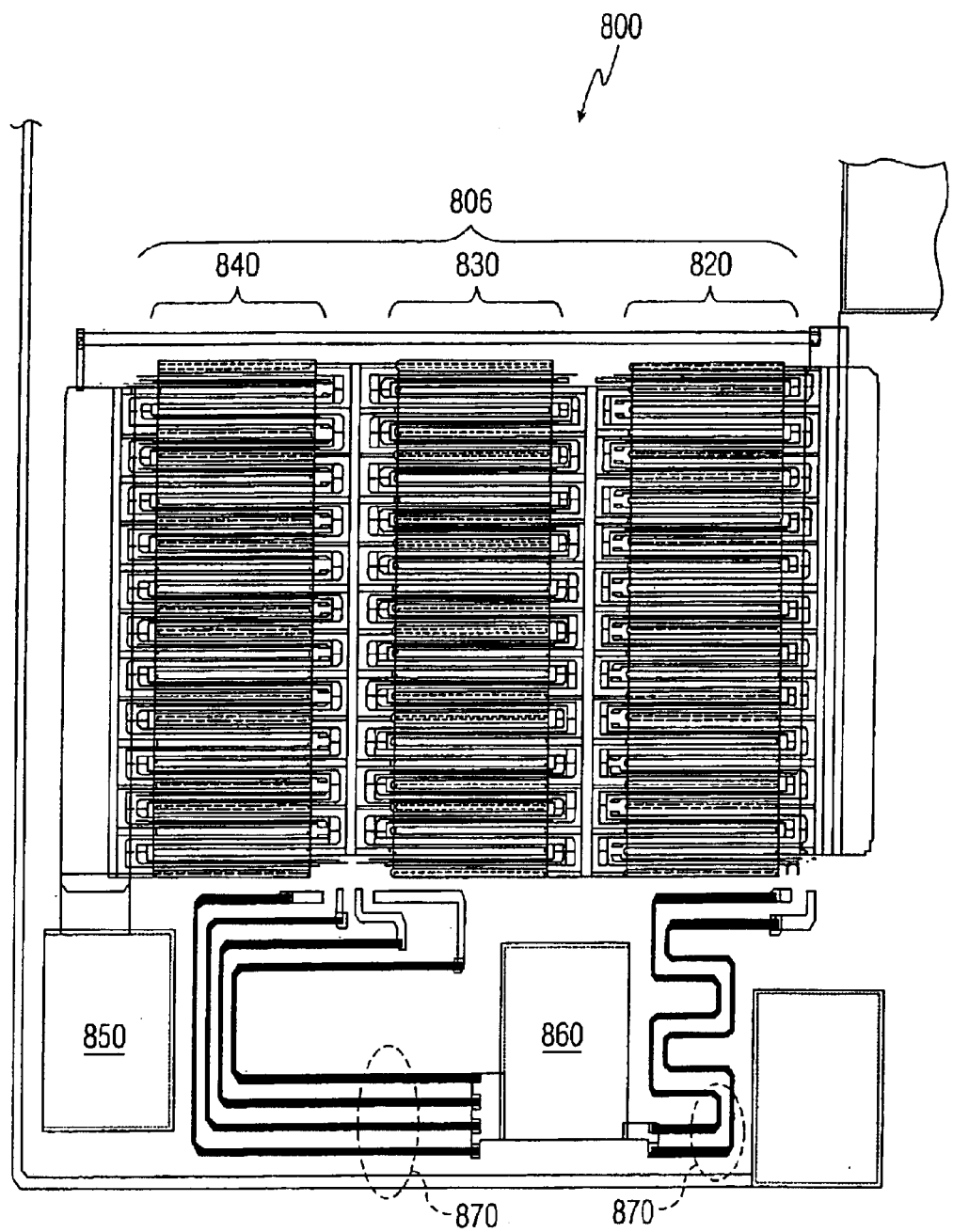
Figure 9D:
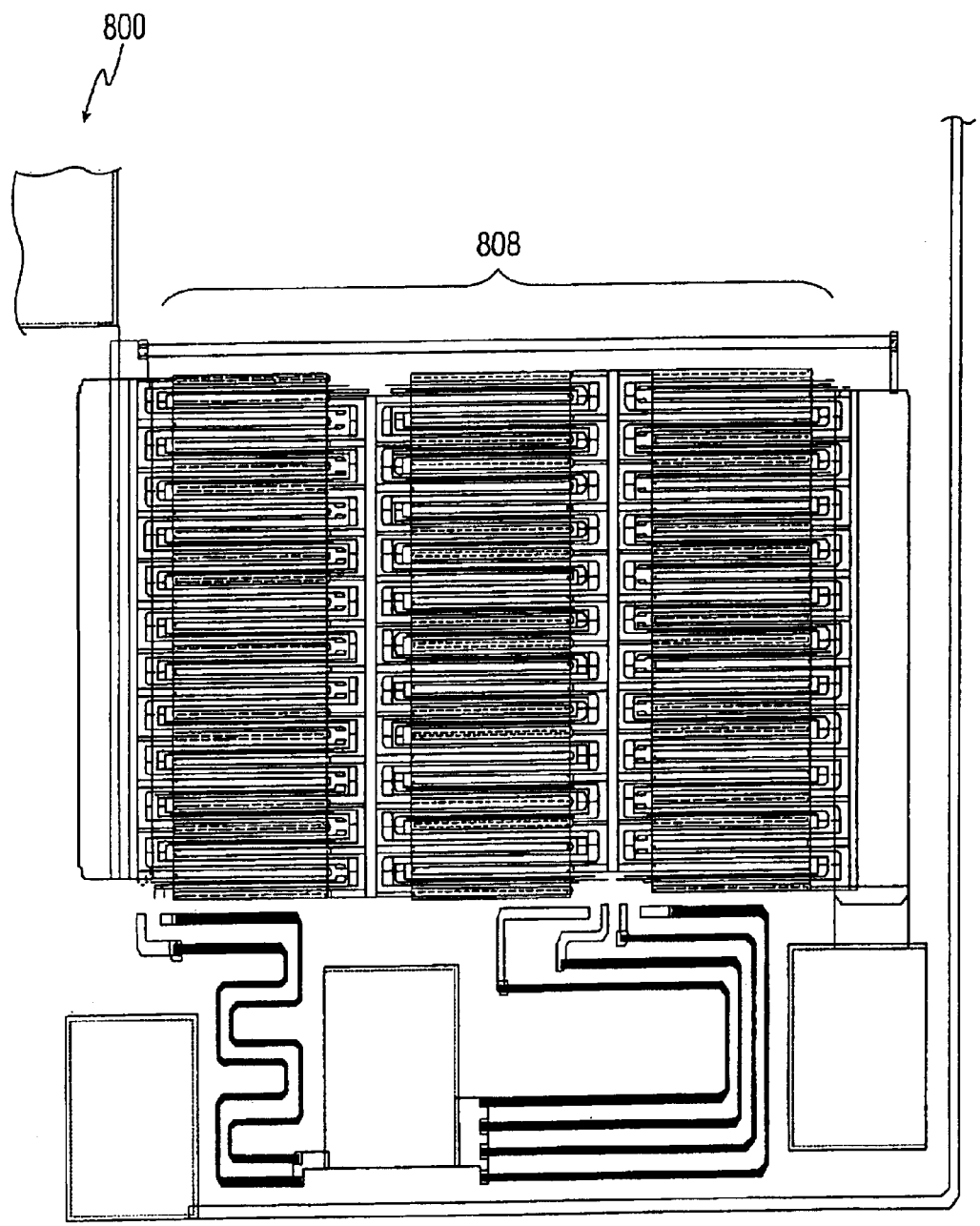

FIG. 9 illustrates an exemplary chip layout of a device 800 utilizing switches, according to one embodiment of the current invention. As illustrated, the device 800 has four parallel sections 802, 804, 806, 808. Each section utilizes 3 dual gate FETs to produce a six-gate switch. The source voltage 810 connects to a source of a first FET of each switch. The specific chip layout of the third switch 806 will now be described, with each other switch 802, 804, 808 having an identical layout.

The source of a first FET 820 is the top capacitor metal layer of a first feed-forward capacitor (or at least a portion of the top capacitor metal layer) as described previously. Dual gates wind between the source and the drain of the first FET 820. The gates (or at least a portion of the gates) of the first FET are connected to the lower capacitor metal layer (or at least a portion of the lower capacitor metal layer) of the first feed-forward capacitor. The drain of the first FET 820 is connected to a source of a second FET 830. Dual gates wind between the source and the drain of the second FET 830. The drain of the second FET 830 is connected to a source of a third FET 840. Dual gates wind between the source and the drain of the third FET 840. The drain of the third FET 840 is the top capacitor metal layer of a second feed-forward capacitor (or at least a portion of the top capacitor metal layer). The gates (or at least a portion of the gates) of the third FET 840 are connected to the lower capacitor metal layer (or at least a portion of the lower capacitor metal layer) of the second feed-forward capacitor.

The drain of the third FET 840 is connected to the output 850. Each of the gates of each FET 820, 830, 840 is connected to a control voltage 860 via a single resistive path 870. The combination of each single resistive path 870 makes up the gate resistance topology (corresponding to exemplary schematic of switch 401 illustrated in FIG. 5b). A single resistive path 880 connects the source of the first FET 820 to the drain of the last FET 840. The single resistive path 880 is the bypass resistance topology (corresponding to exemplary schematic of switch 502 illustrated in FIG. 6b), which results in a high power switch. As previously discussed, this type of switch is likely utilized in (but is not limited to) high power communication devices, such as GSM devices,.

Figure 10:
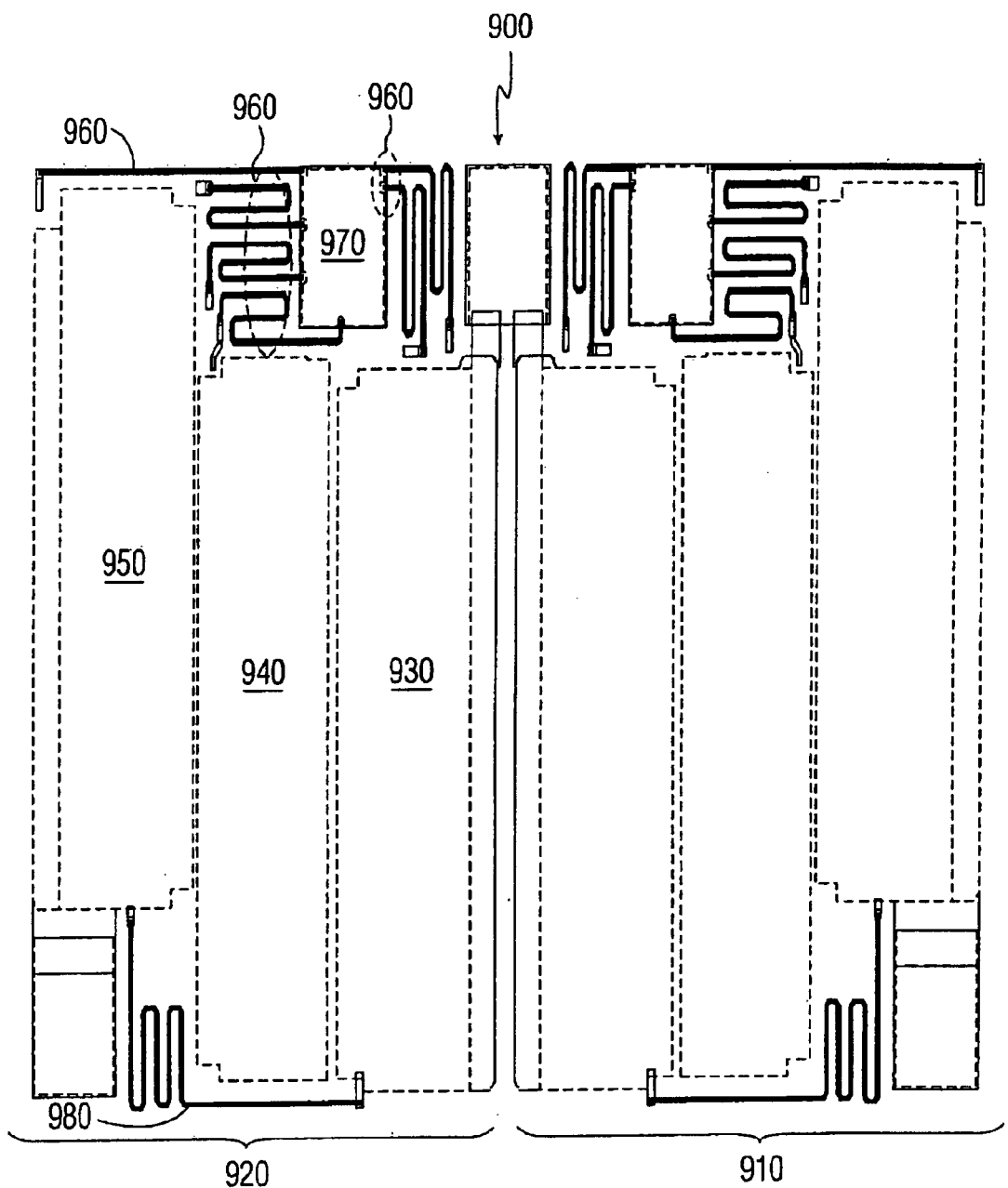
FIG. 10 illustrates an exemplary chip layout design having a plurality of switches, according to one embodiment of the present invention.
Figure 10A:
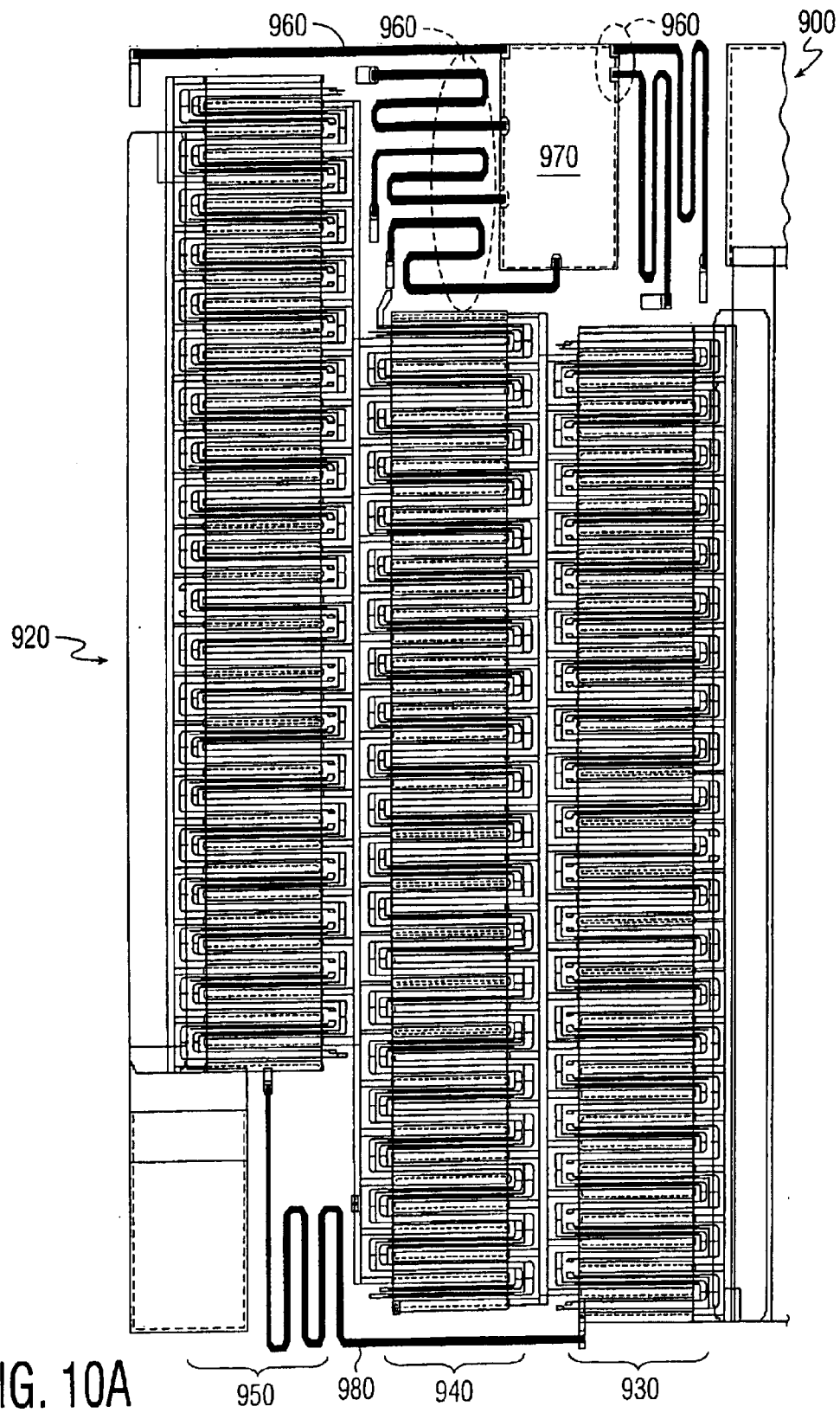
Figure 10B:
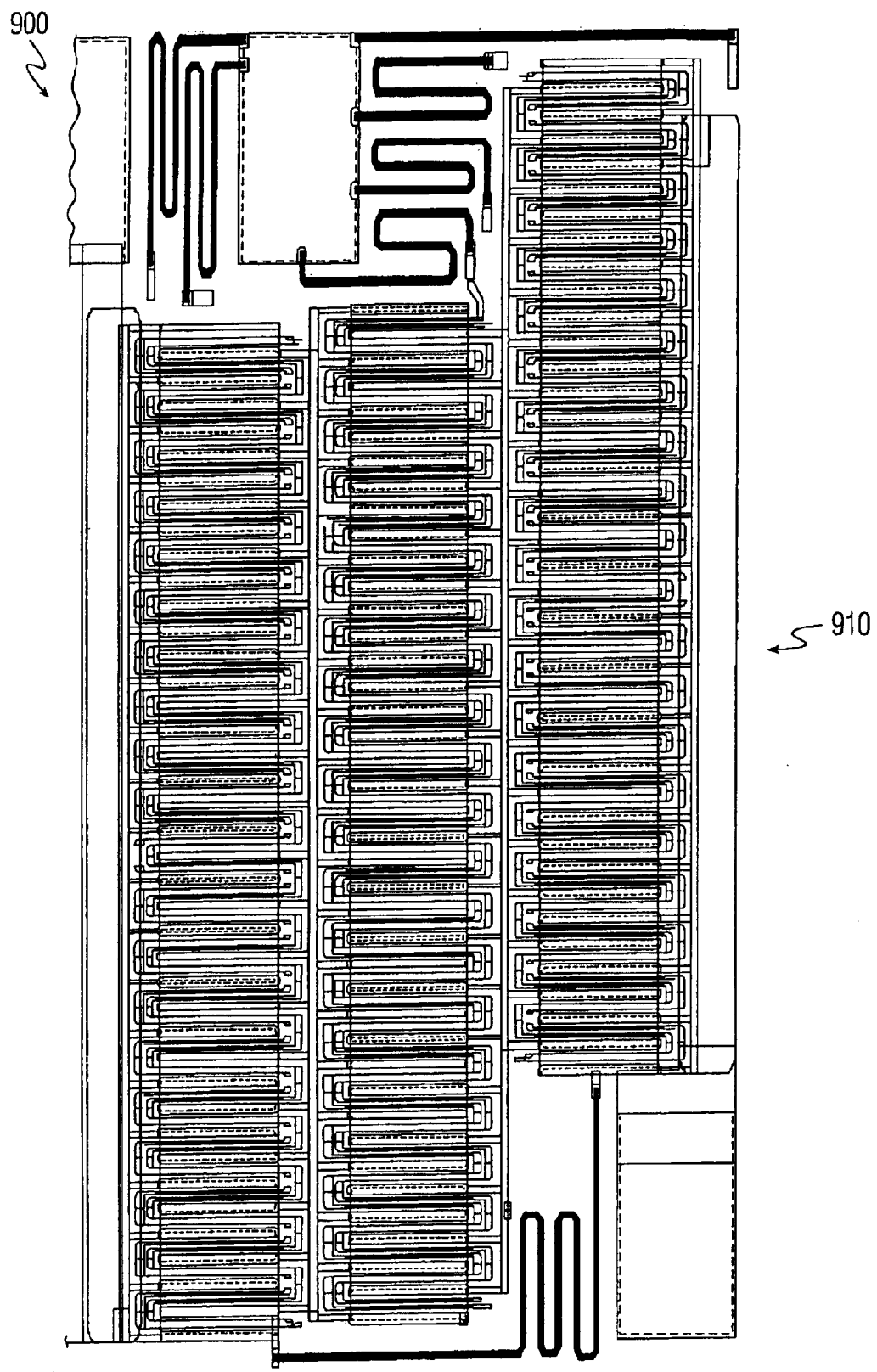
Figure 11:
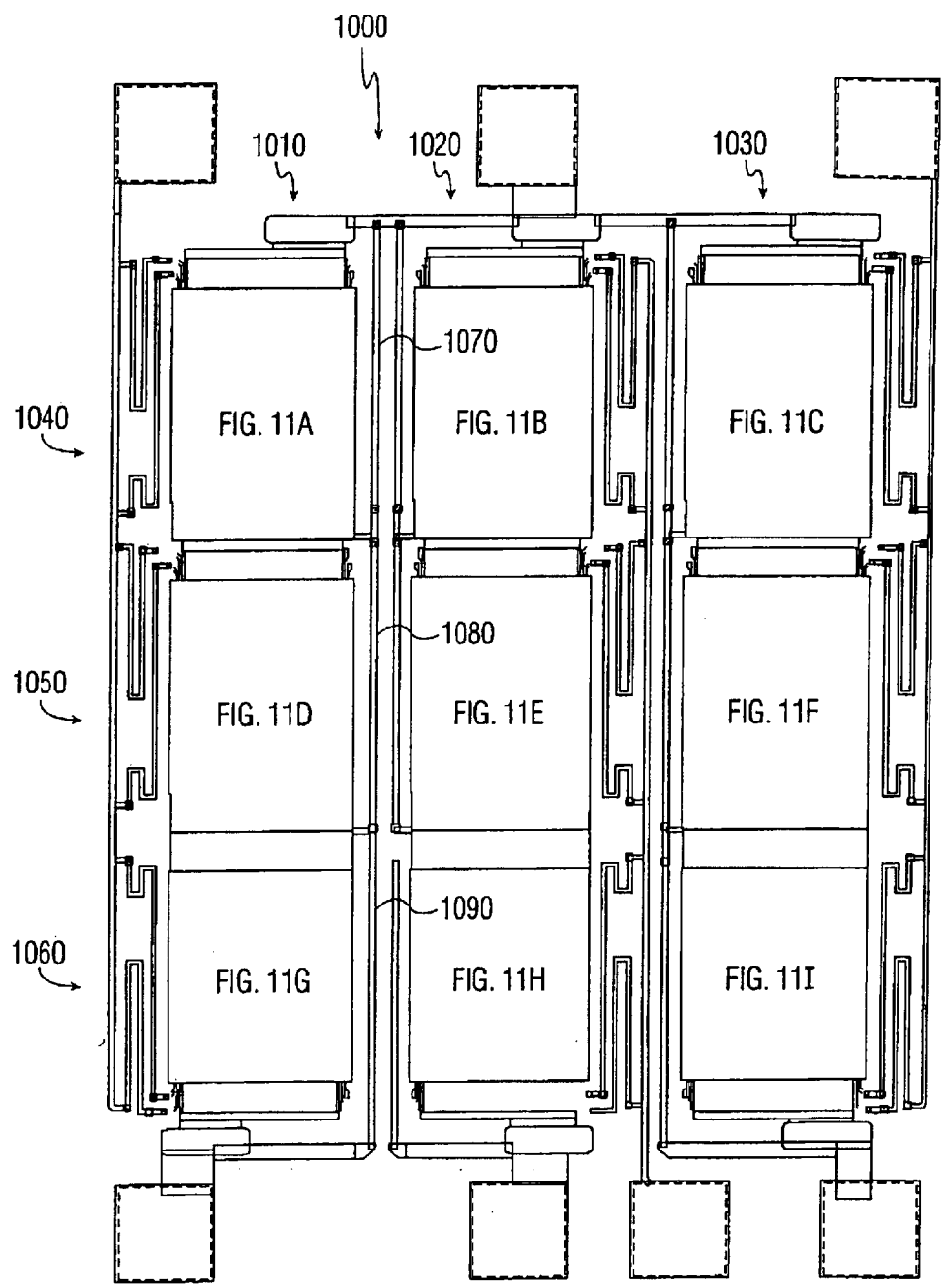
FIG. 11 illustrates an exemplary chip layout design having a plurality of switches, according to one embodiment of the present invention.
Figure 11A:
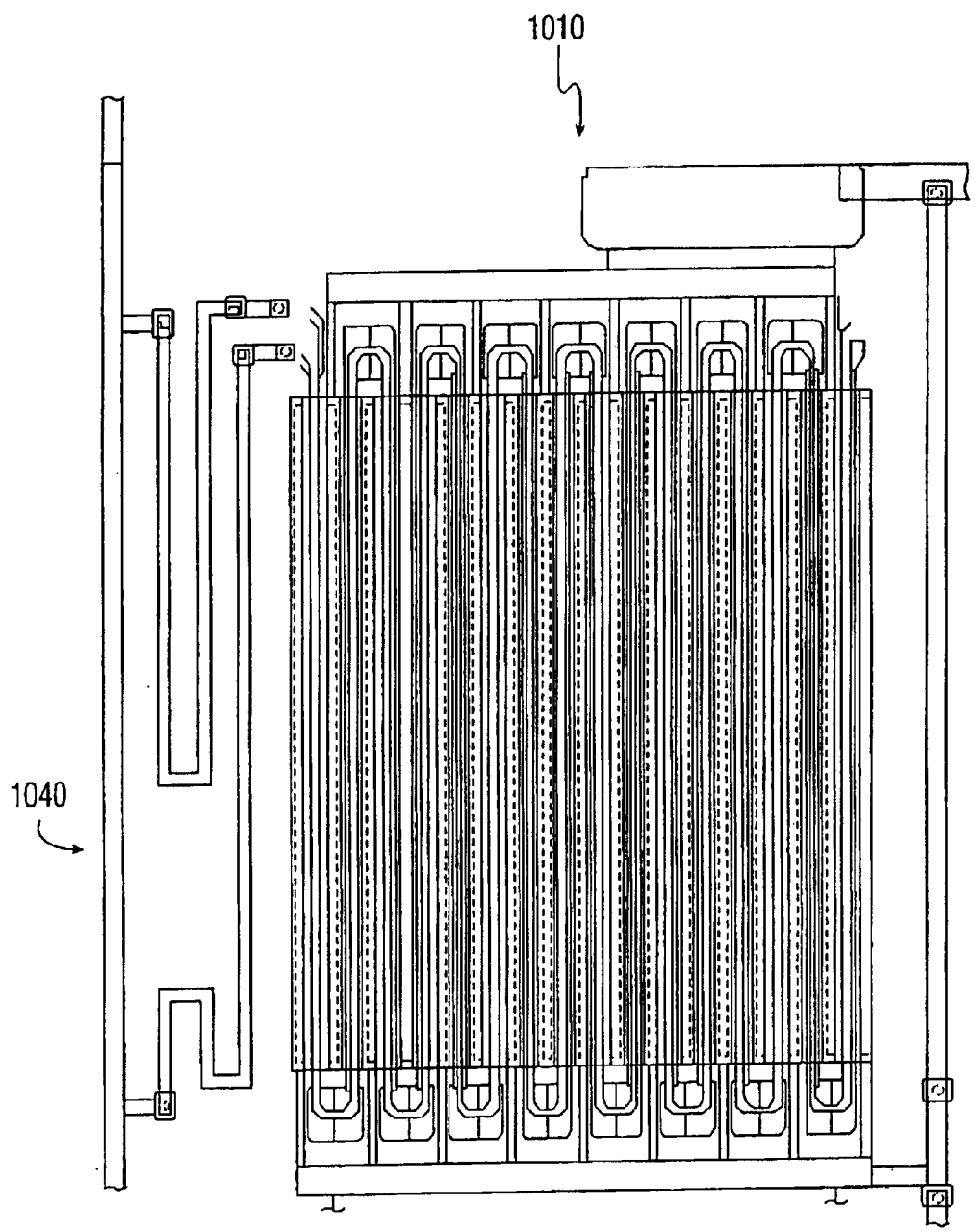
Figure 11B:
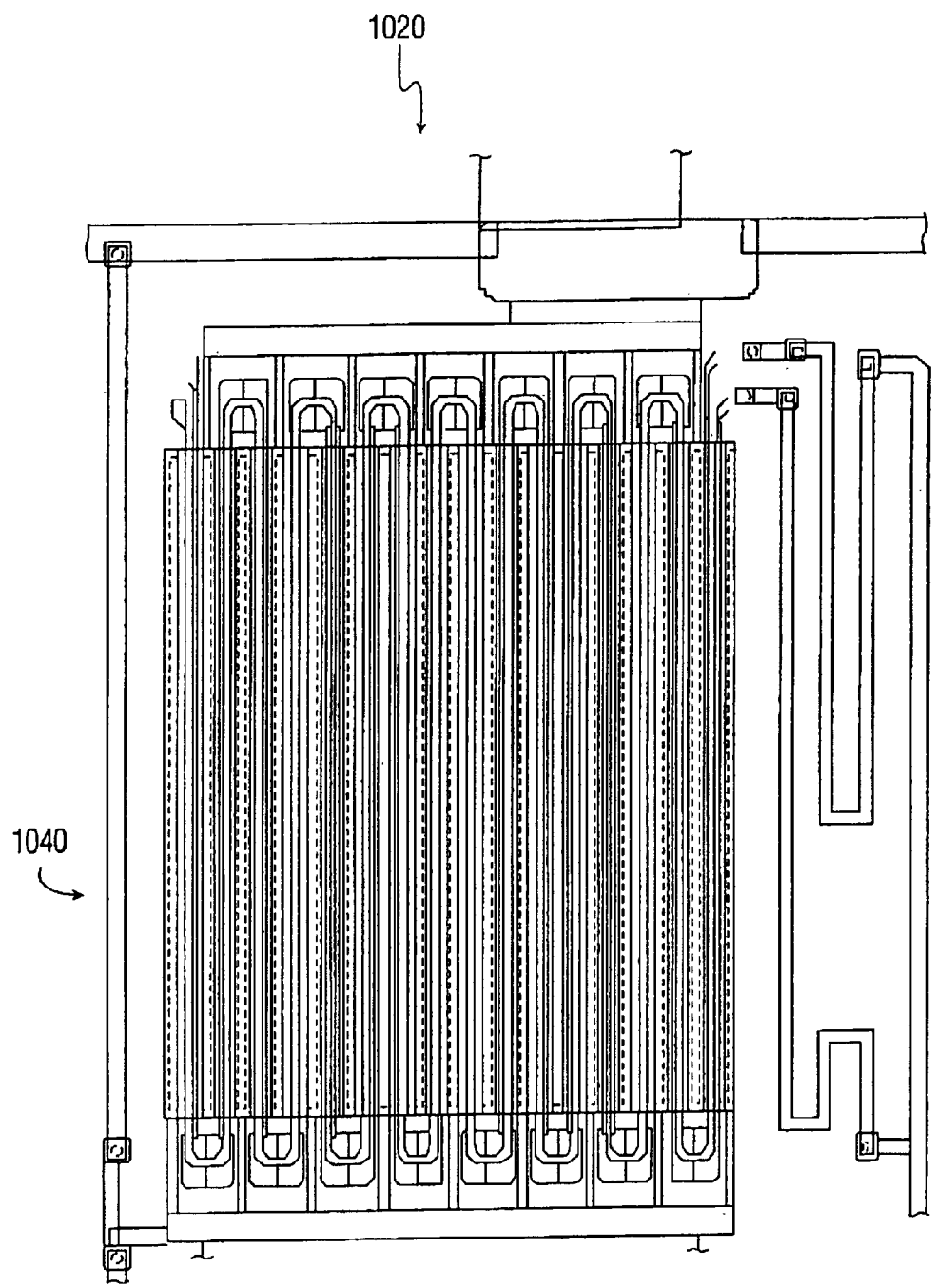
Figure 11C:
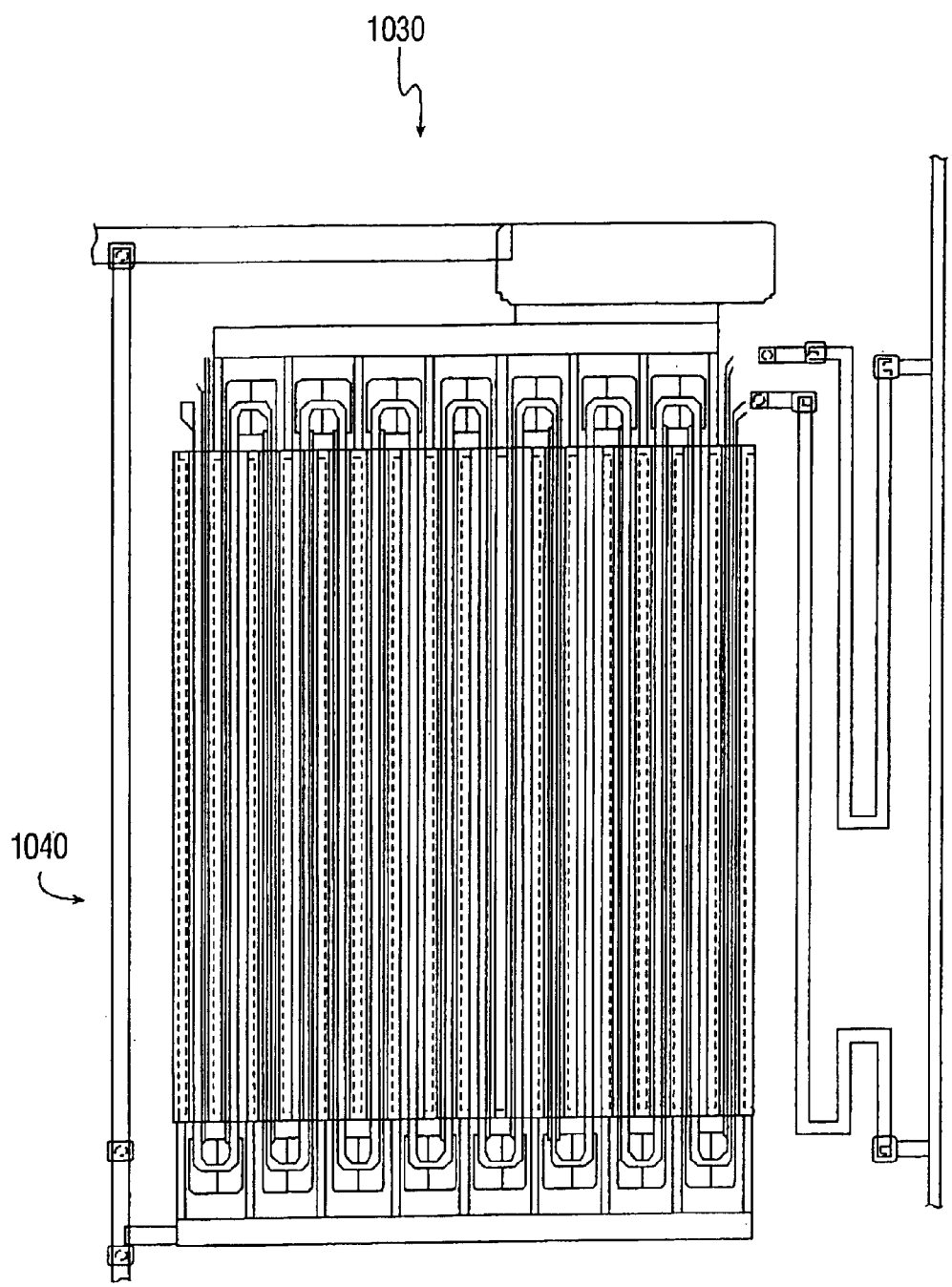
Figure 11D:
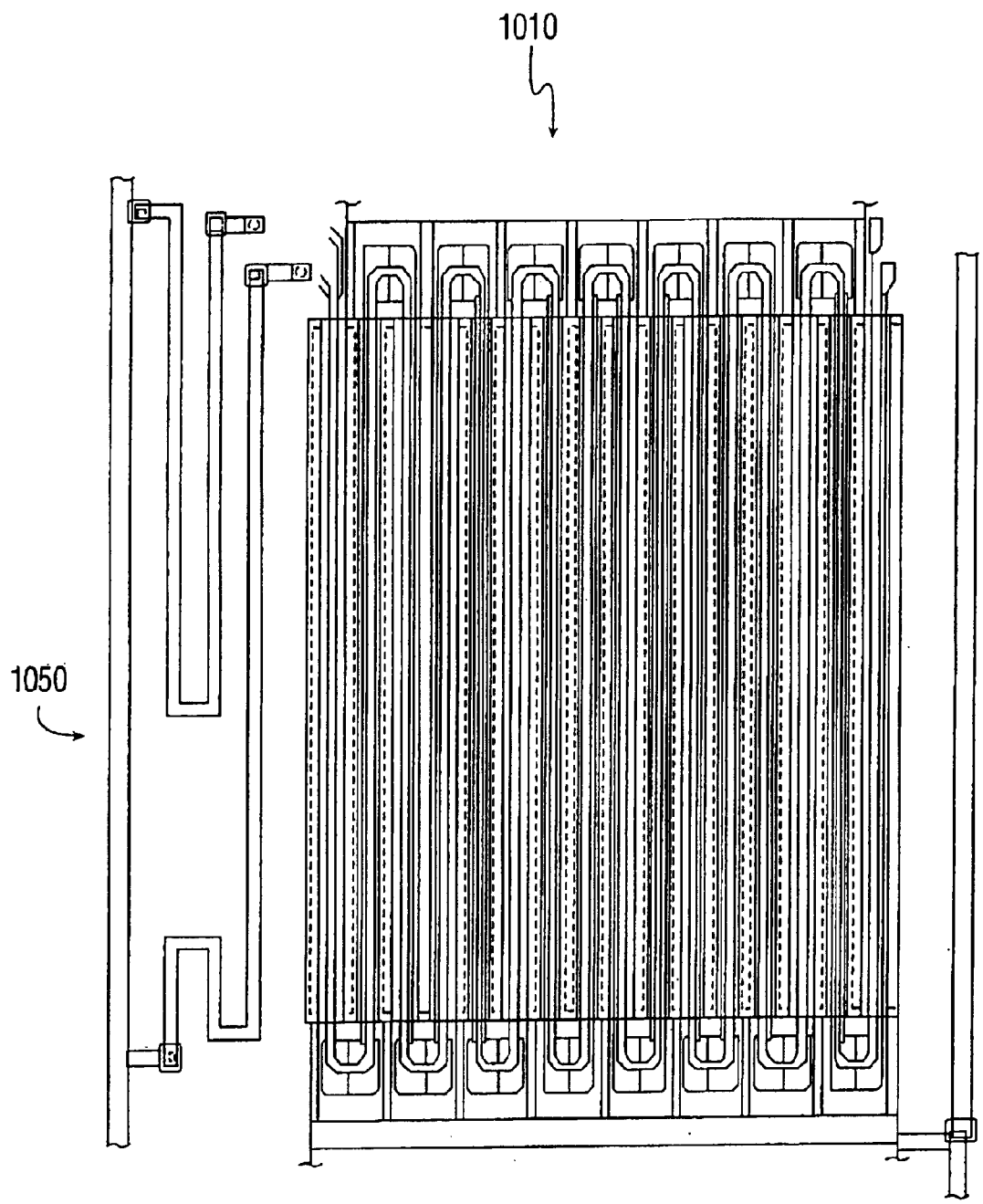
Figure 11E:
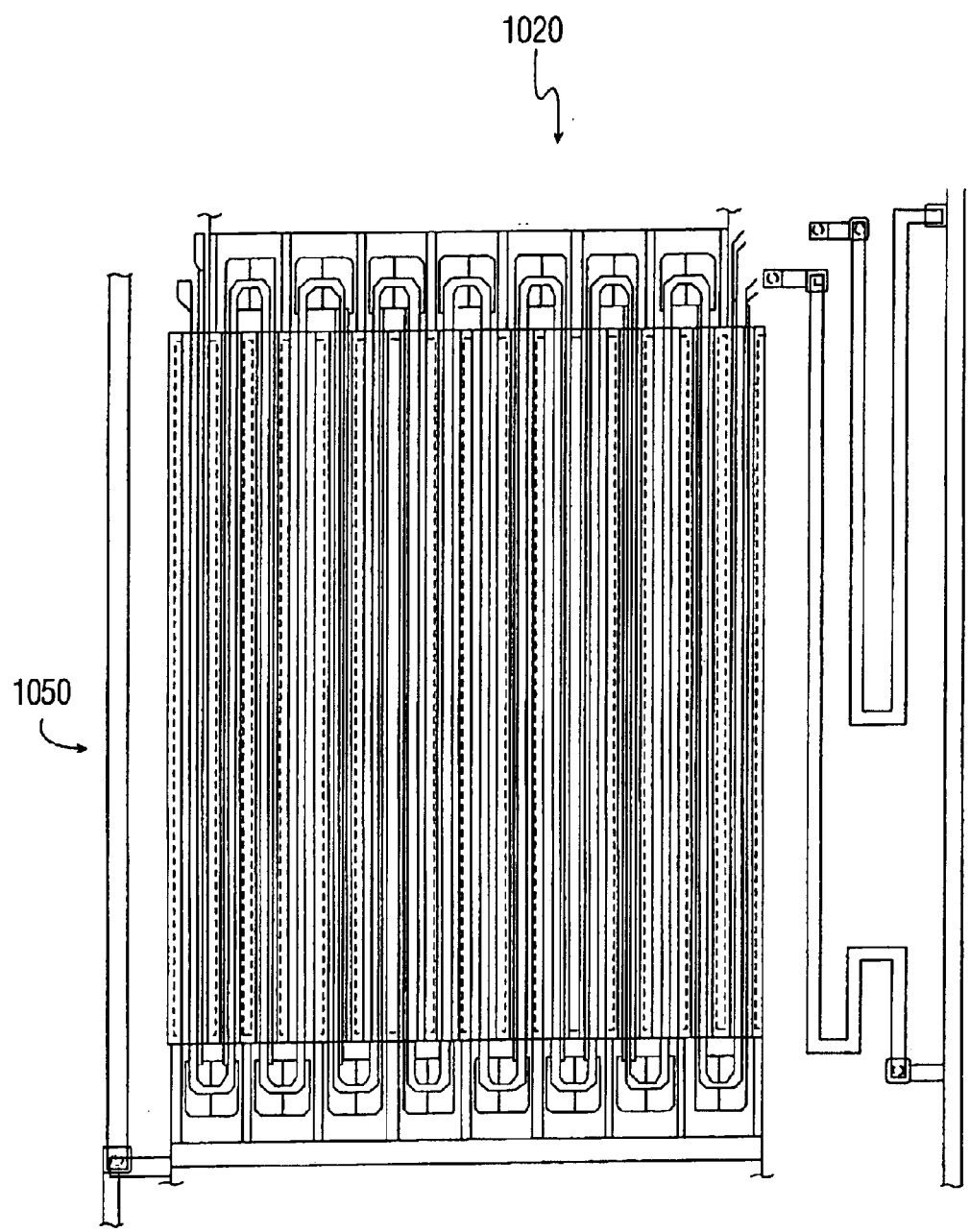
Figure 11F:
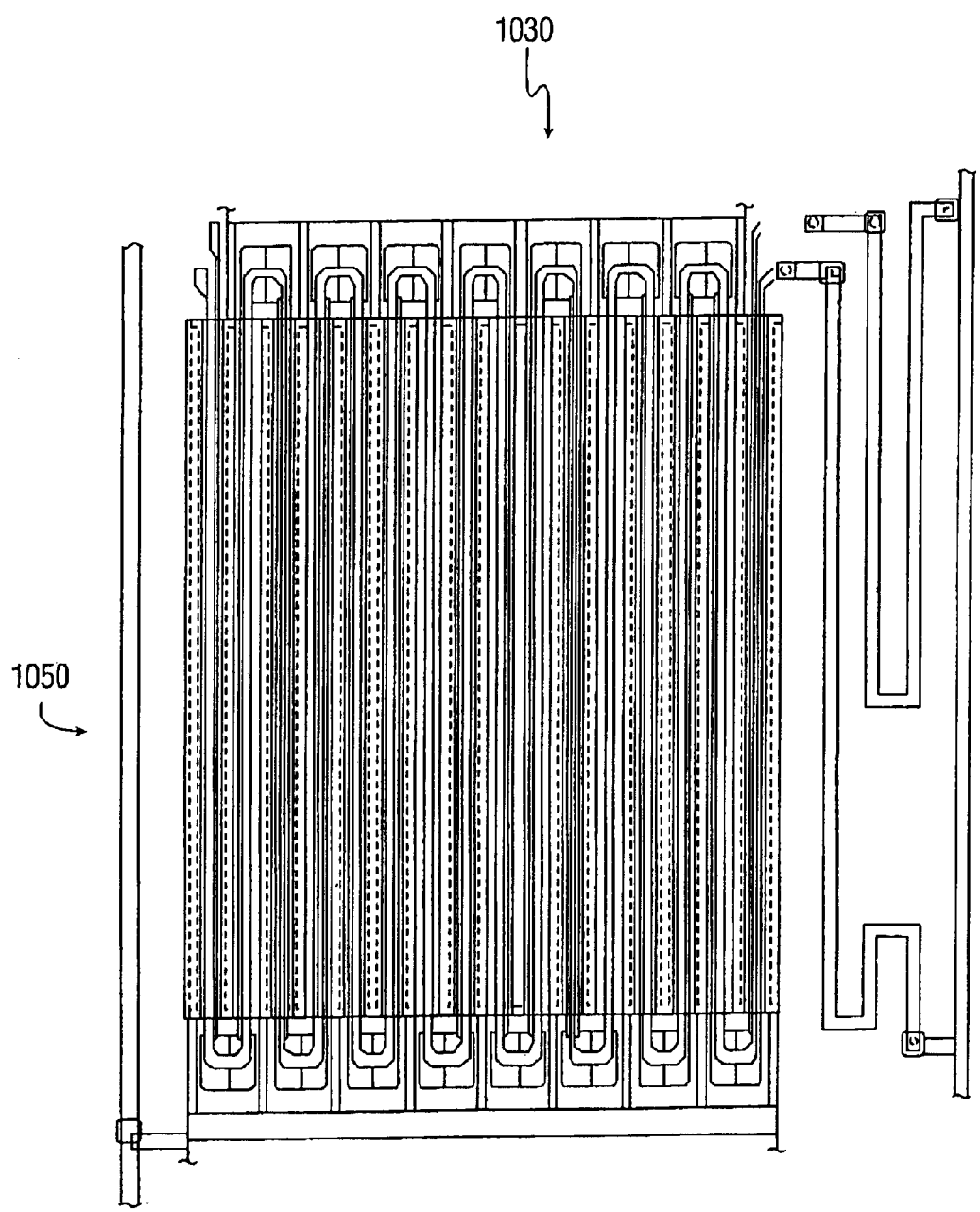
Figure 11G:
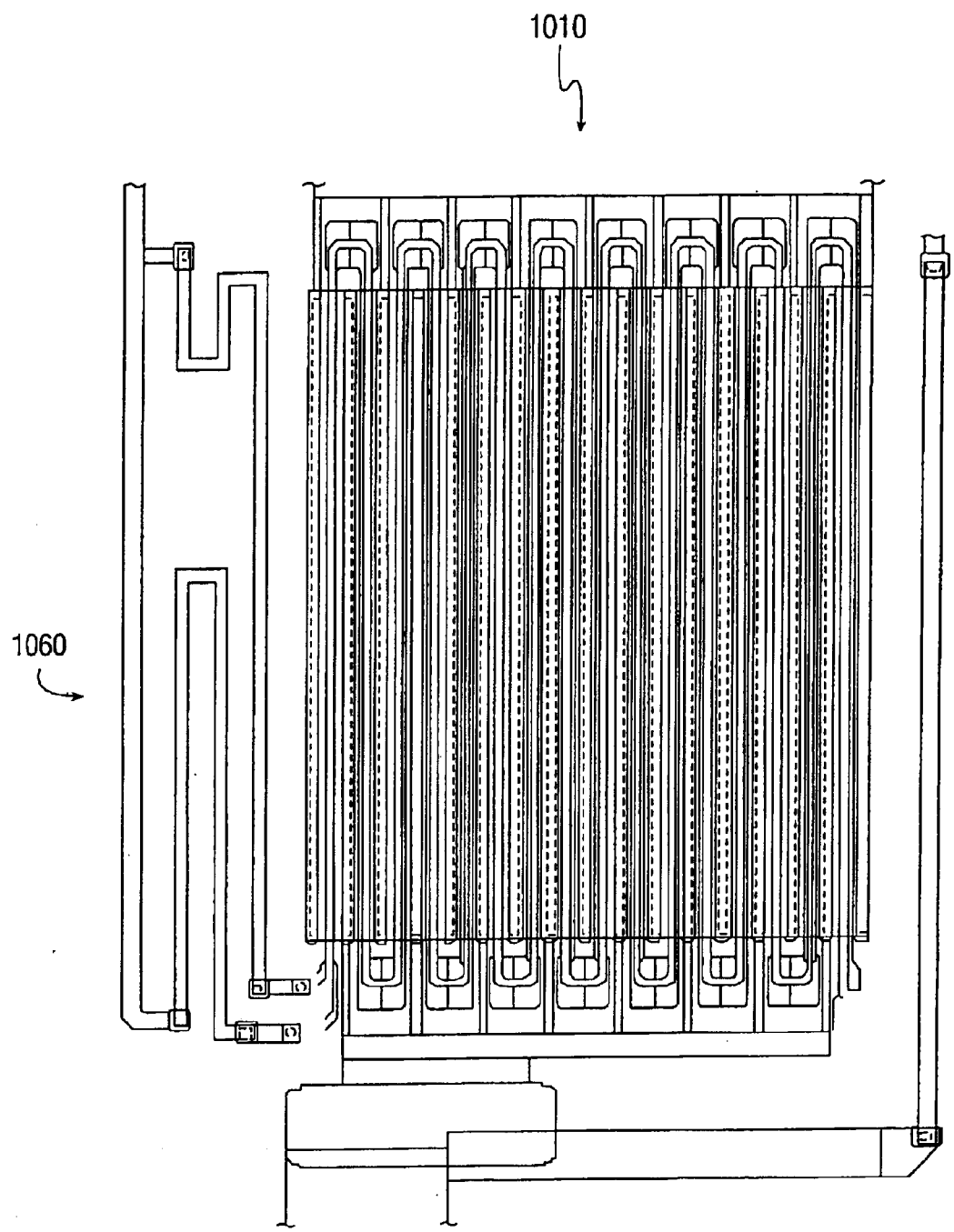
Figure 11H:
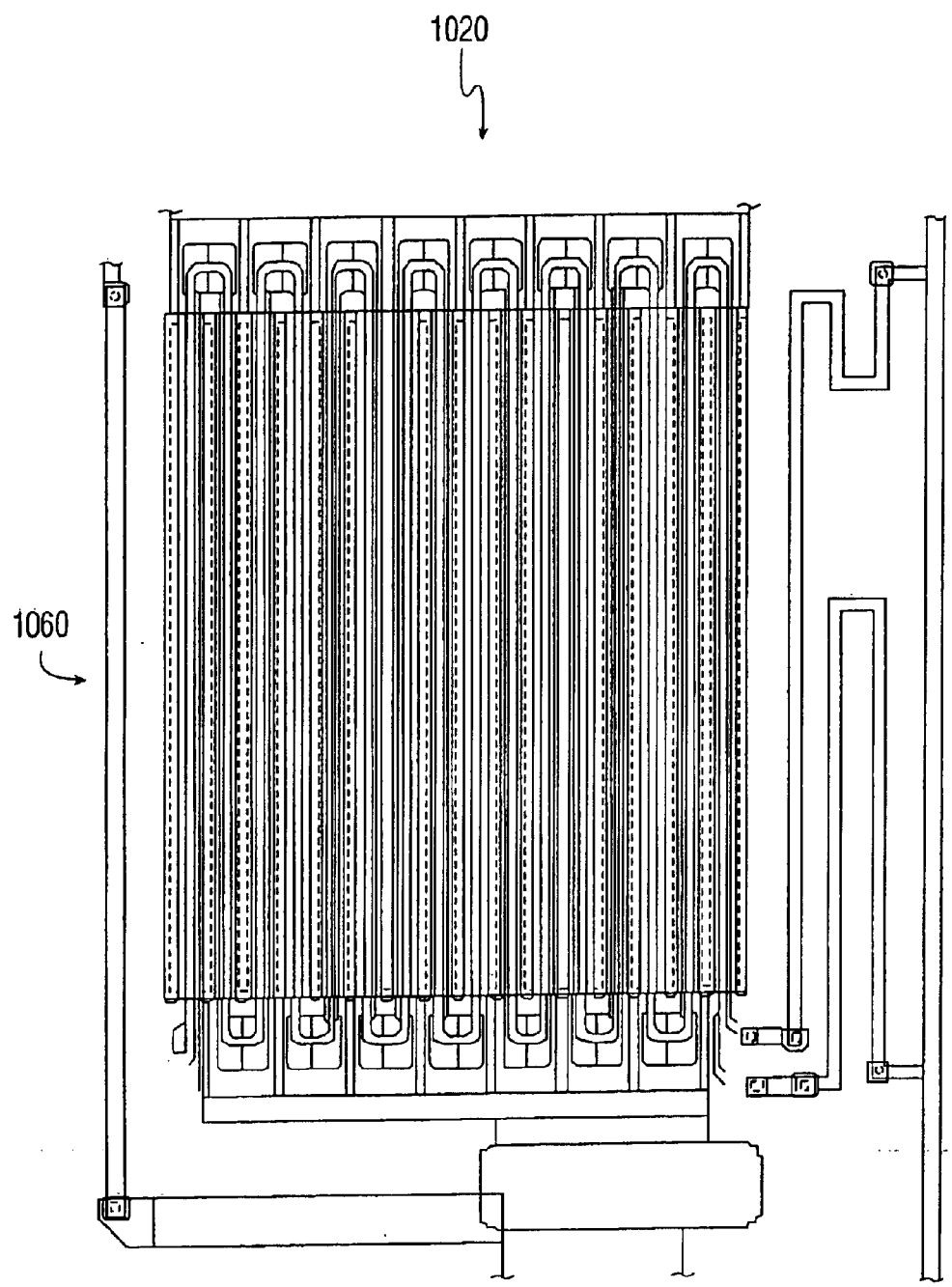
Figure 11I:
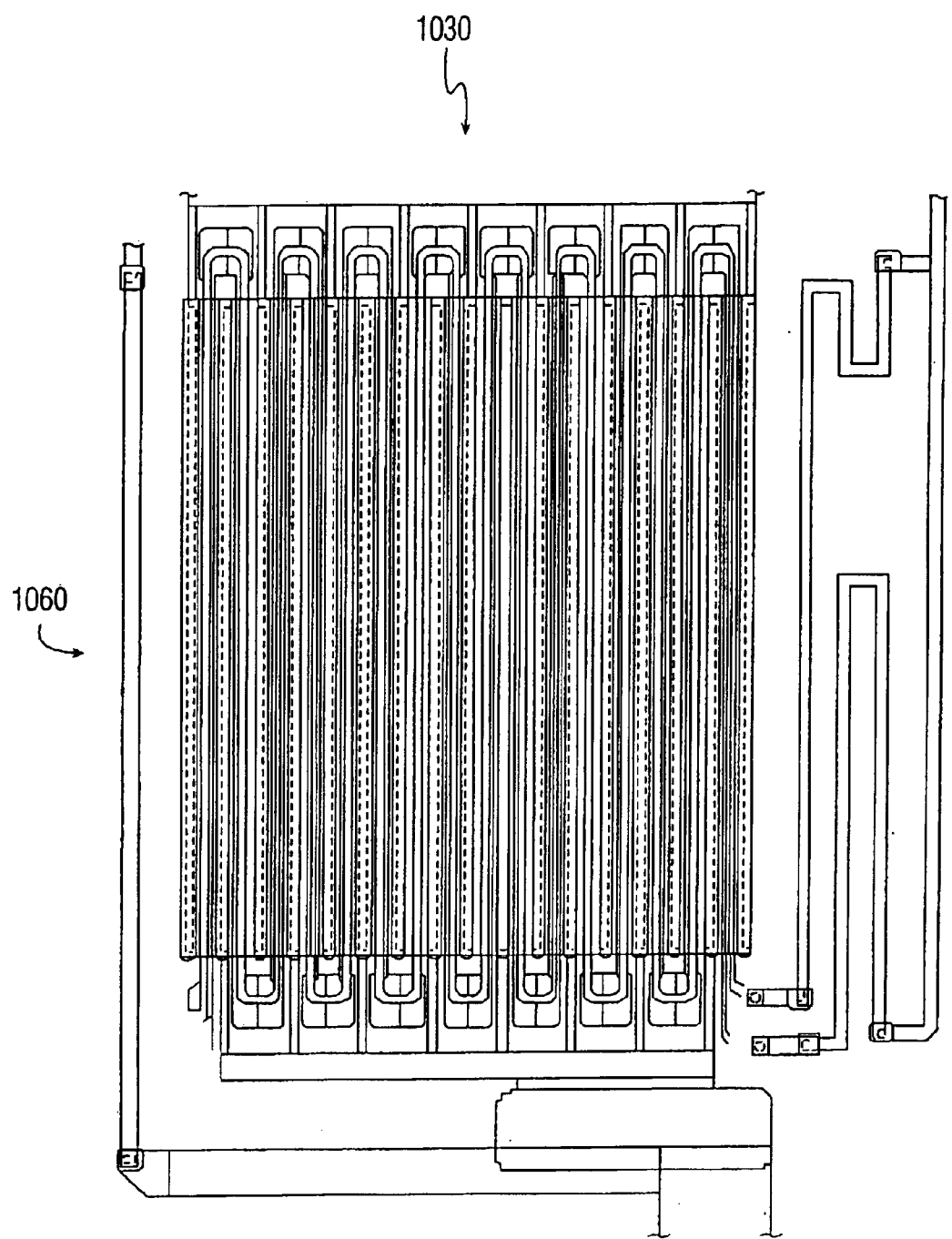

FIG. 10 illustrates an exemplary chip layout of a device 900 utilizing switches, according to one embodiment of the current invention. As illustrated, the device 900 has two parallel sections 910, 920. Each section utilizes three FETs 930, 940, 950 having a mixed gate architecture. The first FET 930 has two gates and two resistive paths 960 connected from the gates of the first FET 930 to the control voltage 970. The second FET 940 has three gates and three resistive paths 960 connected from the gates of the second FET 940 to the control voltage 970. The third FET 950 has one gate and one resistive path 960 connected from the gate of the third FET 950 to the control voltage 970. There is a single bypass resistor 980 that connects the source of the first FET 930 and the drain of the third FET 950 (corresponding to exemplary schematic of switch 502 illustrated in FIG. 6b), which indicates the switch as being a high power switch. As previously discussed, this type of switch is likely utilized in (but is not limited to) high power communication devices, such as GSM devices, FIG. 11 illustrates an exemplary chip layout of a device 1000 utilizing switches, according to one embodiment of the current invention. As illustrated, the device 1000 has three parallel sections 1010, 1020, 1030. Each section utilizes three dual-gate FETs 1040, 1050, 1060. A bypass resistor 1070, 1080, 1090 is coupled across each dual gate FET 1040, 1050, 1060 respectively. The three bypass resistors 1070–1090 make up the bypass resistance topology (corresponding to exemplary schematic of switch 506 illustrated in FIG. 6d) and indicates that the switch is a high linearity switch. As previously discussed, this type of switch is likely utilized in (but is not limited to) communication devices, such as CDMA devices, where low power can be utilized.

Although this invention has been illustrated by reference to specific embodiments, it will be apparent to those skilled in the art that various changes and modifications may be made which clearly fall within the scope of the invention. For example, while FETs are described in relation to the various embodiments, it should be understood that other transistor types, such as an HBT transistor as an example, as well as other suitable types of devices may be utilized where desired. The invention is intended to be protected broadly within the spirit and scope of the appended claims.

What is claimed is:

1. A switch comprising a plurality of field effect transistors (FETs) connected together in series, the plurality of FETs having six gates therebetween.

2. The switch of claim 1, further comprising at least one feed-forward capacitor coupled to at least one of said plurality of FETs.

3. The switch of claim 2, wherein said at least one feed-forward capacitor is coupled to a gate and a source of at least one of said plurality of FETs.

4. The switch of claim 2, wherein said at least one feed-forward capacitor is coupled to a gate and a drain of at least one of said plurality of FETs.

5. The switch of claim 2, wherein said at least one feed-forward capacitor includes a first feed-forward capacitor coupled to a first FET of said plurality of FETs and a second feed-forward capacitor coupled to a last FET of said plurality of FETs.

6. The switch of claim 5, wherein the first feed-forward capacitor is coupled to a source and a gate of the first FET and the second feed-forward capacitor is coupled to a drain and a gate of the last FET.

7. The switch of claim 1, wherein a first FET of said plurality of FETs is connected to a source voltage input.

8. The switch of claim 1, wherein a last FET of said plurality of FETs is connected to an output.

9. The switch of claim 1, wherein a gate of each FET of said plurality of FETs is connected to a control voltage input.

10. The switch of claim 9, further comprising a resistance coupled between at least a subset of the gates and the control voltage input.

11. The switch of claim 10, wherein said resistance includes a plurality of first resistors, at least one first resistor coupled between a gate of each of said plurality of FETs and the control voltage input.

12. The switch of claim 11, wherein each of the at least one first resistors is parallel to each other.

13. The switch of claim 11, wherein said resistance further includes a second resistor coupled between each of the at least one first resistors and the control voltage input.

14. The switch of claim 13, wherein the second resistor is coupled in series to each of the at least one first resistors.

15. The switch of claim 11, wherein said resistance further includes a plurality of second resistors, at least one second resistor coupled between each of two successive at least one first resistors and the control voltage input.

16. The switch of claim 15, wherein each of the at least one second resistors is in parallel with each other at least one second resistor and in series with each of the at least one first resistors it is coupled to.

17. The switch of claim 10, wherein said resistance includes
    a plurality of first resistors, at least one first resistor coupled between the gate of a first FET and the control voltage input and at least one first resistor coupled between the gate of a last FET and the control voltage input;
    a plurality of second resistors, at least one second resistor coupled to the gate of each remaining FET; and
    a third resistor coupled between each of the at least one second resistors and the control voltage input.

18. The switch of claim 17, wherein each of the at least one second resistors is in parallel with each other, the third resistor is in series to each other of the at least one second resistors, and each of the first resistors is in parallel to each second resistor and third resistor combination.

19. The switch of claim 10, wherein said resistance includes
    a plurality of first resistors, at least one first resistor coupled between the gate of a first FET and the control voltage input and at least one first resistor coupled between the gate of a last FET and the control voltage input,
    a plurality of second resistors, at least one second resistor coupled to the gate of each remaining FET; and
    a plurality of third resistors, at least one third resistor coupled between each of two successive second resistors and the control voltage input.

20. The switch of claim 19, wherein the each of two successive second resistors is in parallel with each other, each of the at least one third resistors is in parallel with each other and is in series with the two successive second resistors it is coupled to, and each of the first resistors is in parallel to each second resistor and third resistor combination.

21. The switch of claim 1, further comprising a resistance in parallel to at least a subset of said plurality of FETs.

22. The switch of claim 21, wherein said resistance includes a resistor coupled between a source of a first FET of said plurality of FETs and a drain of a last FET of said plurality of FETs.

23. The switch of claim 21, wherein said resistance includes a plurality of resistors coupled between a source of a first FET of said plurality of FETs and a drain of a last FET of said plurality of FETs.

24. The switch of claim 23, wherein at least one resistor is coupled between a source and a drain for each FET of said plurality of FETs.

25. The switch of claim 1, wherein said plurality of FETs have a single gate architecture.

26. The switch of claim 1, wherein said plurality of FETs have a multi gate architecture.

27. The switch of claim 1, wherein said plurality of FETs have a mixed gate architecture.

28. A switch comprising:
    a plurality of field effect transistors (FETs) connected together in series, each FET having a source, a drain and at least one gate, the plurality of FETs having a total of six gates therebetween;
    a first feed-forward capacitor coupled between the source and the gate of a first FET of said plurality of FETs; and
    a second feed-forward capacitor coupled between the drain and the gate of a last FET of said plurality of FETs.

29. The switch of claim 28, further comprising a gate resistance topology coupled between at least some subset of the six gates and a control voltage input.

30. The switch of claim 29, wherein said gate resistance topology includes at least one resistor coupled between each gate and the control voltage input.

31. The switch of claim 30, wherein each of the at least one resistors coupled between each gate and the control voltage input is in parallel with all other of the at least one resistors.

32. The switch of claim 30, wherein at least some portion of the at least one resistor coupled between a gate and the control voltage input includes a plurality of resistors in series with each other.

33. The switch of claim 28, further comprising a bypass resistance topology connected to be in parallel with at least some subset of said plurality of FETS.

34. The switch of claim 33, wherein said bypass resistance topology is connected between the source of the first FET and the drain of the last FET.

35. The switch of claim 34, wherein said bypass resistance topology includes a single resistor.

36. The switch of claim 34, wherein said bypass resistance topology includes a plurality of resistors.

37. The switch of claim 36, wherein at least one resistor is coupled between a source and drain for each FET of said plurality of FETs.

38. The switch of claim 28, further comprising a gate resistance topology coupled between the six gates and a control voltage input; and a bypass resistance topology connected between the source of the first FET and the drain of the last FET.

39. A device having a plurality of switches in parallel to each other and tied to same source voltage input, each switch comprising:

a plurality of field effect transistors (FETs) connected together in series having a total of six gates therebetween, said plurality of FETs including an uppermost FET connecting to the source voltage input and a lowermost FET connecting to an output;

a first feed-forward capacitor coupled between a source and a gate of the uppermost FET; and a second feed-forward capacitor coupled between a drain and a gate of the lowermost FET.

40. The device of claim 39, wherein each switch further comprises a gate resistance topology coupled between the six gates and a control voltage input.

41. The device of claim 39, wherein each switch further comprises a bypass resistance topology connected between the source of the uppermost FET and the drain of the lowermost FET.

* * * * *